(12) United States Patent
Lee et al.

(10) Patent No.: US 7,863,686 B2
(45) Date of Patent: Jan. 4, 2011

(54) NONVOLATILE MEMORY DEVICES HAVING A FIN SHAPED ACTIVE REGION

(75) Inventors: Chang-Hyun Lee, Gyeonggi-do (KR); Jung-Dal Choi, Gyeonggi-do (KR); Chang-Seok Kang, Gyeonggi-do (KR); Yoo-Cheol Shin, Gyeonggi-do (KR); Jong-Sun Sel, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/536,740

(22) Filed: Aug. 6, 2009

(65) Prior Publication Data

US 2009/0294837 A1    Dec. 3, 2009

Related U.S. Application Data

(62) Division of application No. 11/474,699, filed on Jun. 23, 2006, now Pat. No. 7,605,430.

(30) Foreign Application Priority Data

Jun. 23, 2005  (KR) .................. 10-2005-0054687

(51) Int. Cl.
    *H01L 29/66* (2006.01)
(52) U.S. Cl. ............... 257/368; 257/314; 257/E29.129; 438/201; 438/211; 438/257
(58) Field of Classification Search ......... 257/314–326, 257/368, 390, E29.129, E21.179; 438/201, 438/211, 257
See application file for complete search history.

(56) References Cited

U.S. PATENT DOCUMENTS

2002/0149081 A1   10/2002   Goda et al. .................. 257/510

(Continued)

FOREIGN PATENT DOCUMENTS

JP         2003-078048         3/2003

(Continued)

OTHER PUBLICATIONS

Ng, Complete Guide to Semiconductor Devices, 2002, 2nd, p. 353-358.*

(Continued)

*Primary Examiner*—Eugene Lee
*Assistant Examiner*—Tucker Wright
(74) *Attorney, Agent, or Firm*—Myers Bigel Sibley & Sajovec

(57) ABSTRACT

A nonvolatile memory device includes a semiconductor substrate and a device isolation layer on the semiconductor substrate. A fin-shaped active region is formed between portions of the device isolation layer. A sidewall protection layer is formed on the sidewall of the fin-shaped active region where source and drain regions are formed. Thus, it may be possible to reduce the likelihood of an undesirable connection between an interconnection layer connected to the source and drain regions and a lower sidewall of the active region so that charge leakage from the interconnection layer to a substrate can be prevented or reduced. The sidewall protection layer may be formed using the device isolation layer. Alternatively, an insulating layer having an etch selectivity with respect to an interlayer insulating layer may be formed on the device isolation layer so as to cover the sidewall of the active region.

8 Claims, 34 Drawing Sheets

U.S. PATENT DOCUMENTS

2004/0251487 A1 12/2004 Wu et al. .................... 257/315
2005/0226047 A1* 10/2005 Hieda et al. ............ 365/185.14

FOREIGN PATENT DOCUMENTS

| KR | 10-1996-12483 | 4/1996 |
| KR | 1020030020644 A | 3/2003 |
| KR | 1020040043044 A | 5/2004 |

OTHER PUBLICATIONS

Ruzyllo, "Transistor (R)Evolution", May 15 2003, Penn State University, Semiconductor Notes.

* cited by examiner

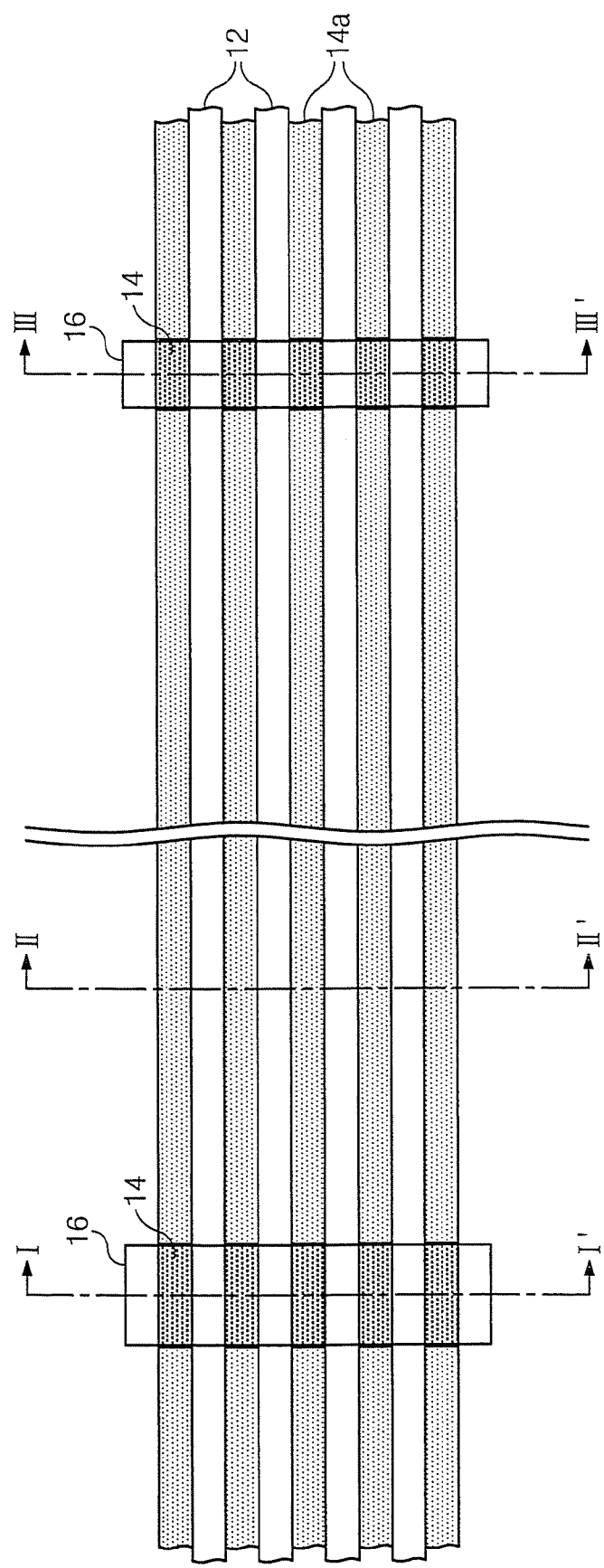

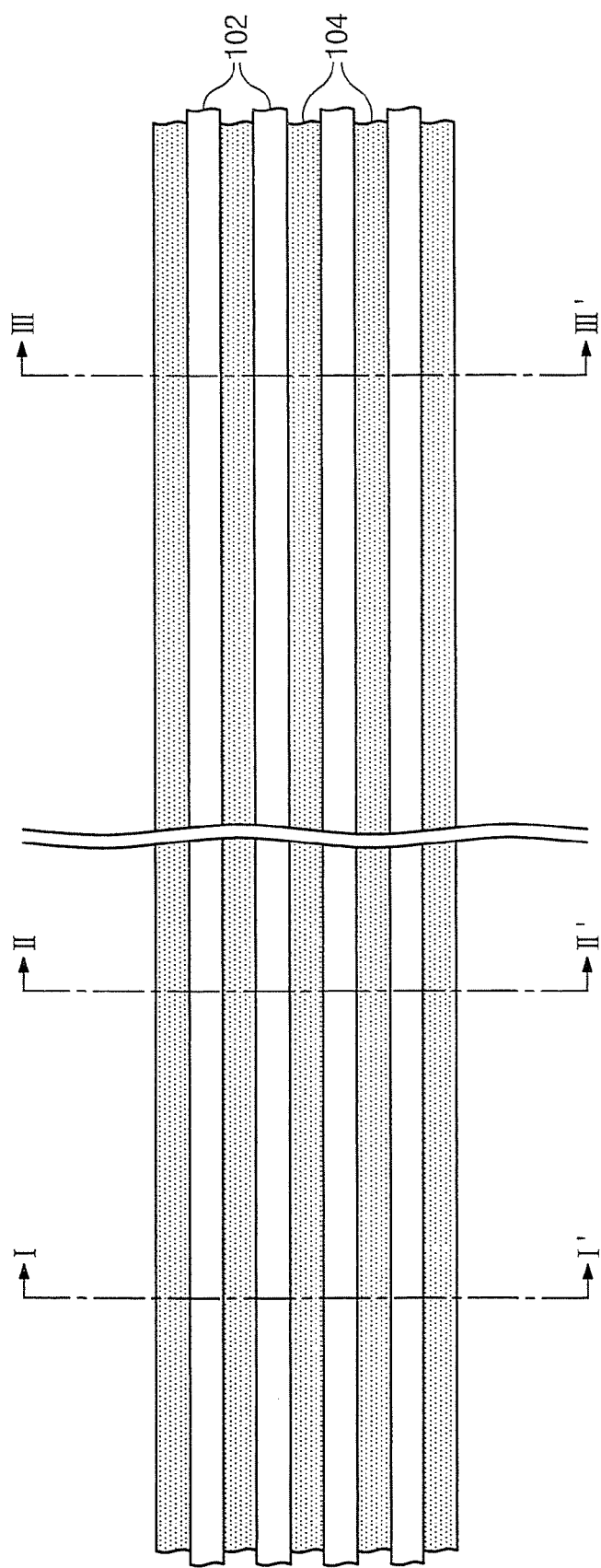

NONVOLATILE MEMORY DEVICES HAVING A FIN SHAPED ACTIVE REGION

REFERENCE TO PRIORITY APPLICATION

This application is a divisional of U.S. application Ser. No. 11/474,699, filed Jun. 23, 2006, now U.S. Pat. No. 7,605,430 the contents of which are hereby incorporated herein by reference.

FIELD OF THE INVENTION

The present invention relates to nonvolatile memory devices and methods of fabricating the same, and, more particularly, to nonvolatile memory devices having a fin shaped active region and methods of fabricating the same.

BACKGROUND

Generally, among nonvolatile memory devices capable of electrically programming and erasing data, flash memory devices are increasingly highlighted as a data storage device because the cell array used therein has a generally high degree of integration.

As memory devices today are generally highly integrated, a channel length and width of a cell transistor may be reduced. A memory device may also have a structure capable of obtaining relatively high cell current despite a low operational voltage, which may suppress a short channel effect, and may suppress a program disturbance between memory cells.

FIG. 1 is an equivalent circuit diagram illustrating a portion of a conventional NAND type memory device, and FIG. 2 is a plane view illustrating a portion of the conventional NAND type memory device.

Referring to FIG. 1, a conventional NAND type flash memory device, which is a representative flash memory device, includes a cell array provided with a plurality of cell strings. Each of the cell strings is configured with a ground select transistor, a string select transistor, and a plurality of memory cells. The ground select transistor and the string select transistor are connected in series between a source region and a drain region. The plurality of memory cells are connected in series between the ground select transistor and the string select transistor. The cell array includes a plurality of ground and string select gate lines GSL and SSL, and a plurality of word lines WLn disposed between the string select gate line SSL and the ground select gate line GSL. A bit line BLn is arranged such that it crosses over the word line WLn and is connected to the drain region through a bit line contact DC. The source regions are interconnected to each other in a column direction to thereby form a common source line CSL.

The ground select gate line GSL, the string select gate line SSL, and the word line WLn are arranged such that they cross over active regions ACT defined by a device isolation layer ISO. The common source line CSL is arranged such that it crosses over the active region between the ground select gate lines GSL of an adjacent cell string and is electrically connected to the underlying active regions. The bit line contact DC is in contact with the active region between the adjacent string select lines SSL and is connected to the bit line (not shown) crossing over the word lines.

A nonvolatile memory device may have a fin field effect transistor (FinFET) structure. The FinFET structure, which uses a sidewall of a fin-shaped active region as a channel of a transistor, may include beneficial features, such as low subthreshold swing, high transconductance, suppression of short channel effect, and the like. Therefore, the FinFET may be considered an adaptive structure for securing characteristics of the transistor of which the feature size is 50 nm or less.

Because the FinFET structure has certain advantages, such as high controllability of a gate with respect to a channel, low depletion capacitance, and so forth, the FinFET structure may be used in various nonvolatile memory devices, such as a flash memory device.

SUMMARY

Some embodiments of the present invention provide a nonvolatile memory device having a structure in which a channel of a cell transistor is formed on sidewalls of a fin-shaped active region, but the leakage current of source and drain regions can also be suppressed.

Some embodiments of the present invention provide nonvolatile memory devices capable of suppressing the leakage current through the source and drain regions by forming a sidewall protection layer on the sidewalls of the fin-shaped active region. The nonvolatile memory device includes a fin-shaped active region formed between device isolation layers, a word line crossing over the fin-shaped active region, and source and drain regions formed in the fin-shaped active region.

In some embodiments, the word line has a surface opposite to the sidewall of the fin-shaped active region and crosses over the fin-shaped active region. An interlayer insulating layer covers the entire surface of the substrate. In the source and drain regions, the interlayer insulating layer is in contact with the top surface of the active region. An insulating layer having an etch selectivity with respect to the interlayer insulating layer is in contact with the sidewall of the active region on which the source and drain regions are formed.

In other embodiments, the active region and an interconnection layer may be misaligned with each other when forming the interconnection layer to be connected with the source region or the drain region by etching the interlayer insulating layer.

In still other embodiments, because the fin-shaped active region upwardly protrudes from the substrate, the doping concentration may become low at a lower portion of the active region even though a tilted ion implantation process is used. If the interconnection layer is in contact with lower sidewalls of the active region where the doping concentration is low or impurities are not doped, there may occur a leakage current between the interconnection layer and the substrate. However, according to some embodiments of the present invention, because an etching process for the interlayer insulating layer stops due to the sidewall protection layer, it may be possible to avoid extending the interconnection layer toward the lower sidewalls of the active region.

In still other embodiments, the interlayer insulating layer includes an etch stop layer in contact with the top surface of the active region, wherein the etch stop layer has an etch selectivity with respect to the device isolation layer. The sidewall protection layer may be the device isolation layer in contact with the etch stop layer. The device isolation layer is recessed under the word line so that the word line has a surface opposite to the sidewall of the active region and encompasses the sidewall of the active region where the source and drain regions are formed. Therefore, the device isolation layer may act as an etch stop layer in etching the interlayer insulating layer, to thereby prevent the sidewall of the active region from being exposed.

In still other embodiments, a sidewall protection layer in contact with the active region is formed on the device isolation layer by forming an insulating layer having an etch selectivity with respect to the interlayer insulating layer. In forming the active region of which the width is less than the channel length of the cell transistor, it may be possible to enhance the controllability of the gate with respect to the channel and suppress the short channel effect.

In still other embodiments, the present invention is applied to a NAND type nonvolatile memory device. In this case, it may be possible to prevent or reduce the leakage current between a common source line/a bit line contact and the substrate. In the NAND type nonvolatile memory device, the word line having a surface opposite to the sidewall of the fin-shaped active region crosses over the fin-shaped active region. Alternatively, the select gate line has or does not have a surface opposite to the sidewall of the active region and crosses over the active region.

In still other embodiments, the sidewall of the active region in the source and drain regions are in contact with the sidewall protection layer. In this case, the sidewall protection layer is an insulating layer having an etch selectivity with respect to the interlayer insulating layer in contact with the top surface of the active region. The device isolation layer is recessed lower than the active region in the cell array region, and the sidewall protection layer is an insulating layer that is formed on the recessed device isolation layer and is in contact with the sidewall of the active region.

In further embodiments, the device isolation layer is divided into a low region and a high region. A word line is formed on the low region of the device isolation layer. Adjacent to the high region of the device isolation layer, the source and drain regions are formed to be in contact with the sidewall of the active region. The lowermost layer of the interlayer insulating layer is formed of a material having an etch selectivity with respect to the device isolation layer so that the device isolation layer acts as an etch stop layer for the lowermost layer of the interlayer insulating layer.

In still further embodiments, a transistor having a FinFET structure may have a relatively low threshold voltage in comparison with a flat transistor. To reduce the likelihood that the select transistor has a negative threshold voltage, the select transistor may be formed as a flat transistor in a NAND type nonvolatile memory device. Therefore, the select gate line is formed over the high region of the device isolation layer or formed such that it overlaps with the high region and the low region of the device isolation layer.

In further embodiments of the present invention, there are provided methods of fabricating a nonvolatile memory device capable of suppressing the leakage current through the source and drain regions by forming a sidewall protection layer on a sidewall of the fin-shaped active region. In some embodiments, the memory device is fabricated by forming a device isolation layer on a semiconductor substrate to define a fin-shaped active region, and recessing the device isolation layer to expose the sidewall of the active region. The word line is formed so as to cross over the active region. The source region and the drain region are formed on the active region.

In other embodiments, an interlayer insulating layer is formed on the entire surface of the substrate where the word line, the source region, and the drain region are formed. The sidewall protection layer is formed on the sidewall of the active region in which the source and drain regions are formed. The sidewall protection layer is formed of a material having an etch selectivity with respect to the interlayer insulating layer in contact with the top surface of the active region.

In further embodiments, when recessing the device isolation layer, the device isolation layer in contact with the sidewall of the active region where the source and drain regions are formed is not recessed but remains intact. As a result, the sidewall protection layer is formed by making use of the device isolation layer.

In still other embodiments, the device isolation layer is in contact with the sidewall of the active region where the source and drain regions are formed and is also recessed to expose the sidewall of the active region. An insulating layer is conformally formed over the substrate where the source and drain regions are formed, and anisotropically etched to form the sidewall protection layer as a spacer.

In still further embodiments, the active region is thermally oxidized to form a thermal oxide layer. Thereafter, the thermal oxide layer is removed to thereby reduce the width of the active region.

BRIEF DESCRIPTION OF THE DRAWINGS

FIGS. 3A to 7A are plane views that illustrate a nonvolatile memory device according to some embodiments of the present invention and methods of fabricating the same;

FIGS. 3B to 7B are cross-sectional views taken along the lines I-I' of FIGS. 3A to 7A, respectively;

FIGS. 3C to 7C are cross-sectional views taken along the lines II-II' of FIGS. 3A to 7A, respectively;

FIGS. 3D to 7D are cross-sectional views taken along the lines III-III' of FIGS. 3A to 7A, respectively;

FIGS. 10A to 12A are plane views illustrating a nonvolatile memory device according to still further embodiments of the present invention and methods of fabricating the same;

FIGS. 10B to 12B are cross-sectional views taken along the lines I-I' of FIGS. 10A to 12A, respectively;

FIGS. 10C to 12C are cross-sectional views taken along the lines II-II' of FIGS. 10A to 12A, respectively;

FIGS. 10D to 12D are cross-sectional views taken along the lines III-III' of FIGS. 10A to 12A, respectively;

DETAILED DESCRIPTION OF THE INVENTION

Figure 1:
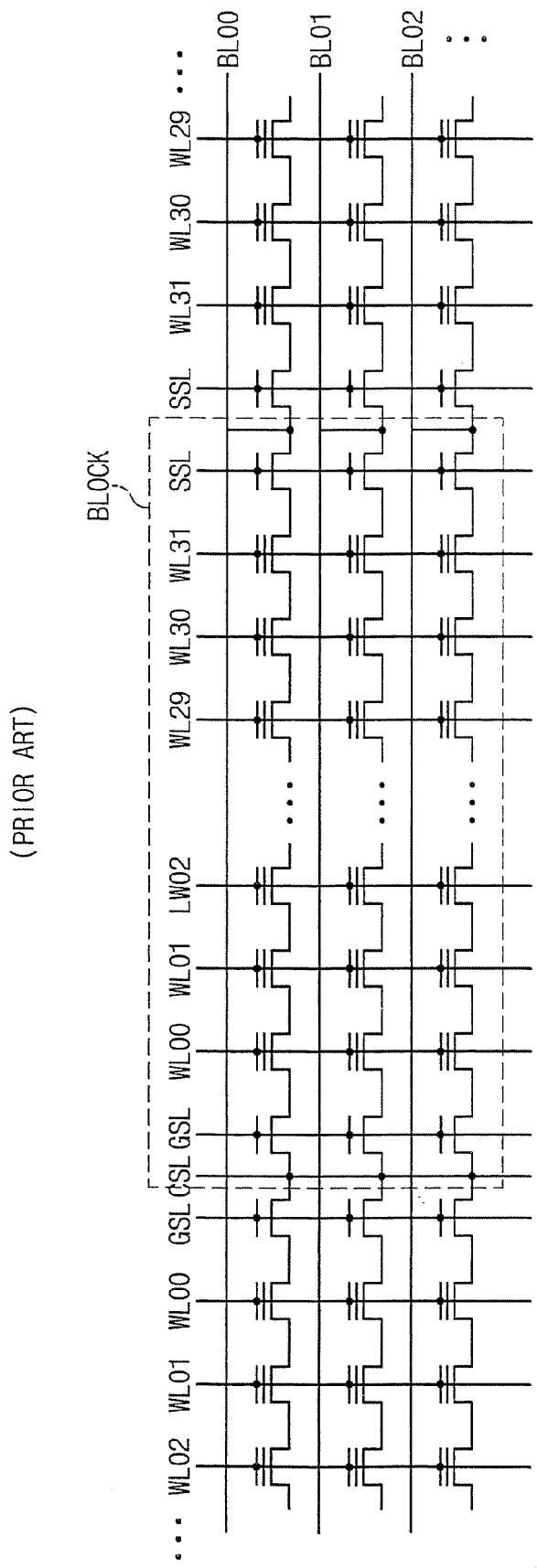
FIG. 1 is an equivalent circuit diagram that illustrates a portion of a conventional NAND type memory device.
Figure 2:
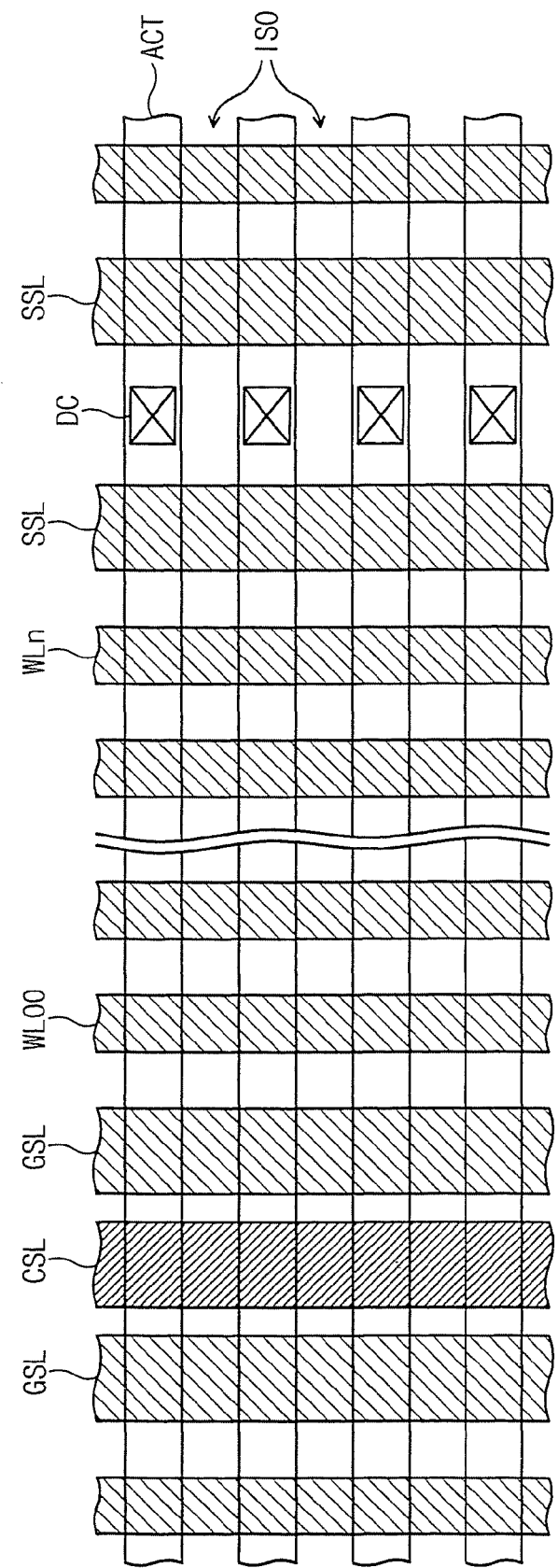
FIG. 2 is a plane view that illustrates a portion of the conventional NAND type memory device.
Figure 3A:
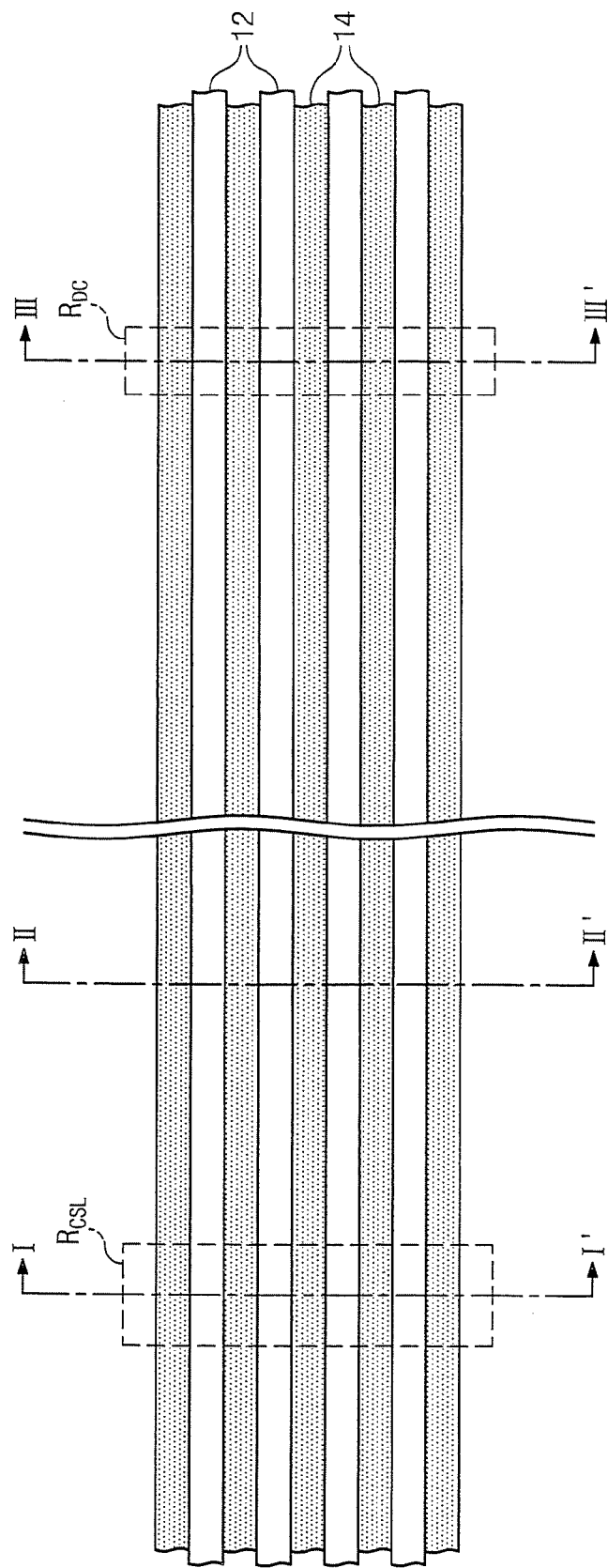
Figure 3B:
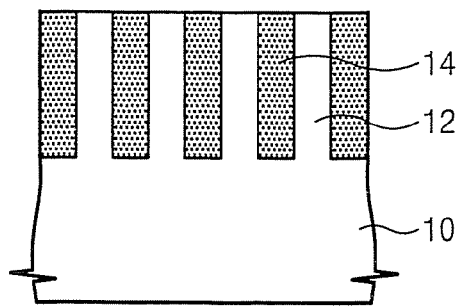
Figure 3C:
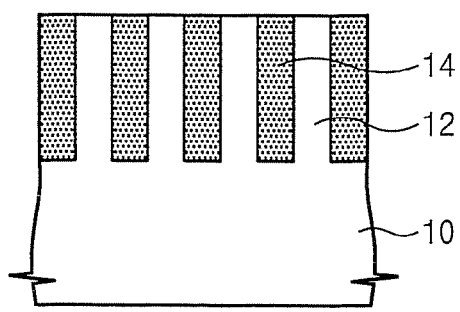
Figure 3D:
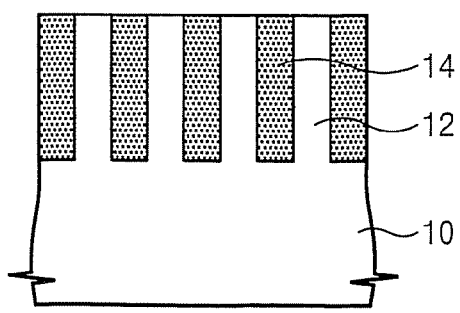
Figure 4B:
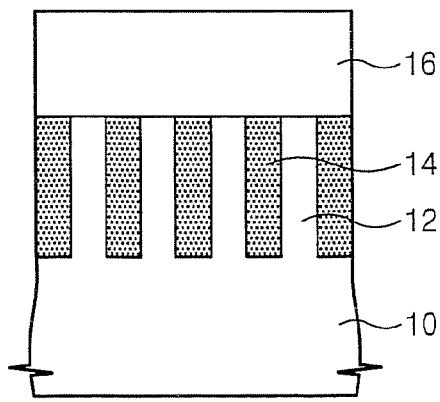
Figure 4C:
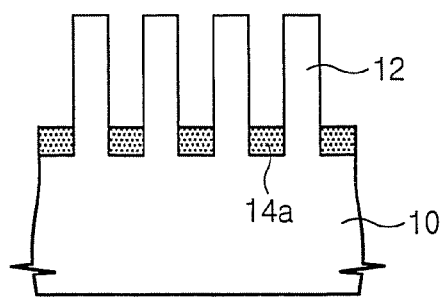
Figure 4D:
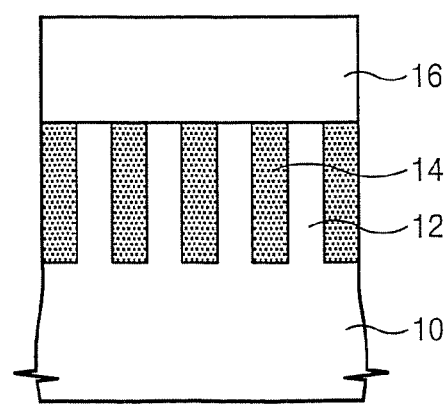

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

FIGS. 3A to 7A are plane views illustrating a nonvolatile memory device according to first embodiments of the present invention and a methods of fabricating the same.

FIGS. 3B to 7B are cross-sectional views taken along the lines I-I' of FIGS. 3A to 7A, respectively. FIGS. 3C to 7C are cross-sectional views taken along the lines II-II' of FIGS. 3A to 7A, respectively. FIGS. 3D to 7D are cross-sectional views taken along the lines III-III' of FIGS. 3A to 7A, respectively.

Referring to FIGS. 3A to 3D, on a semiconductor substrate 10, there are formed a plurality of fin-shaped active regions 12 and a device isolation layer 14 defining the fin-shaped active regions 12. The device isolation layer 14 may be formed using a shallow trench isolation (STI) technique. The fin-shaped active region 12 may be formed such that its width is about 50 Å or less. In forming a NAND type cell array, the active region 12 and the device isolation layer 14 may be defined in the shape of stripes, which are substantially parallel with one another in a predetermined direction. To illustrate characteristics of some embodiments of the present invention in detail, a common source region $R_{CSL}$ and a contact region $R_{DC}$ are defined first, wherein the common source region $R_{CSL}$ is a region where a common source line is formed and the contact region $R_{DC}$ is a region where a bit line contact is formed.

Referring to FIGS. 4A to 4D, a mask pattern 16 is formed such that it covers the common source region $R_{CSL}$ and the contact region $R_{DC}$. Thereafter, a portion of the device isolation layer 14 is removed using the mask pattern 16 as an etch mask. As a result, the device isolation layer 14 is divided into a high region 14 and a low region 14a. Sidewalls of the active region 12 are exposed between the low regions 14a of the device isolation layer. The mask pattern 16 may be formed of a material having an etch selectivity with respect to the device isolation layer 14 and the active region 12. For example, the mask pattern 16 may be formed of photoresist or silicon nitride. The remaining thickness of the low region 14a of the device isolation layer may be determined based on the channel width of a transistor and a parasitic transistor formed under the device isolation layer.

Referring to FIGS. 5A to 5D, the mask pattern 16 is removed, and a plurality of word lines WLn are formed crossing over the active region 12. In a NAND type cell array, select gate lines, i.e., a ground select gate line GSL and a string select gate line SSL are formed, as well as a plurality of word lines WLn. The word line and the select gate line may be formed of a conductive layer 20 having a surface opposite to the sidewall of the fin-shaped active region 12. In a charge-trap type nonvolatile memory device, a charge storage insulating layer 18 may be formed between the word line WLn and the fin-shaped active region 12.

In the first embodiments, the region where the word line and the select gate line are formed is the low region 14a of the device isolation layer. Both the common source region $R_{CSL}$ and the contact region $R_{DC}$ cross over the high region 14 of the device isolation layer. Therefore, the sidewalls of the active region 12 in the common source region $R_{CSL}$ and the contact region $R_{DC}$ are covered with the device isolation layer 14.

Referring to FIGS. 6A to 6D, impurities are implanted into the active region 12 to form a source region 21s and a drain region 21d. The impurities are also implanted into the active region between the word lines, and between the word line and the select gate line so that an impurity diffusion layer is formed.

Thereafter, an interlayer insulating layer is formed over the entire surface of the substrate 10 where the source and drain regions 21s and 21d are formed. Herein, the interlayer insulating layer includes an etch stop layer 22, which covers the entire surface of the substrate and is in contact with the active region 12, and a first interlayer insulating layer 24, which is formed on the etch stop layer 22 and covers the entire surface of the substrate. The etch stop layer 22, which is an insulating layer having an etch selectivity with respect to the device isolation layer 14, is in contact with the device isolation layer 14 as well as the top surface of the active region 12. The etch stop layer 22 may be formed of a silicon nitride layer, and the first interlayer insulating layer 24 may be formed of a silicon oxide layer.

Referring to FIGS. 7A to 7D, a common source line CSL is formed such that it penetrates through the first interlayer insulating layer 24 and the etch stop layer 22 and contacts with the source region 21s. The common source line CSL crosses over the active regions 12 and electrically connects the underlying source regions 21s to one another.

A second interlayer insulating layer 26 is formed on the entire surface of the substrate where the common source line CSL is formed. The second interlayer insulating layer 26, the first interlayer insulating layer 24, and the etch stop layer 22 are etched in sequence, to form a contact hole exposing the top surface of the active region 12. Afterwards, the contact hole is filled with a conductive layer so that a bit line contact DC connected to the drain region 21d is formed. If the sidewall of the active region where the source and drain regions 21s and 21d are formed is exposed by employing a FinFET structure, a lower portion of the active region is not doped with impurities or the doping concentration is low so that the charge leakage may occur through the substrate should the bit line contact DC make contact with the exposed sidewall of the active region. However, according to the first embodiments of the present invention, because the sidewall of the active region on which the source region 21s and the drain region 21d are formed is covered with the device isolation layer 14, the device isolation layer 14 is not etched in the contact hole even if the contact hole and the active region are misaligned with each other. Accordingly, the sidewall of the active region under the drain region 21s is not exposed due to the etch of the device isolation layer 14. As a result, it is possible to avoid or reduce the problem leakage current occurring between the common source line CSL/bit line contact DC and the substrate 10.

Figure 8A:
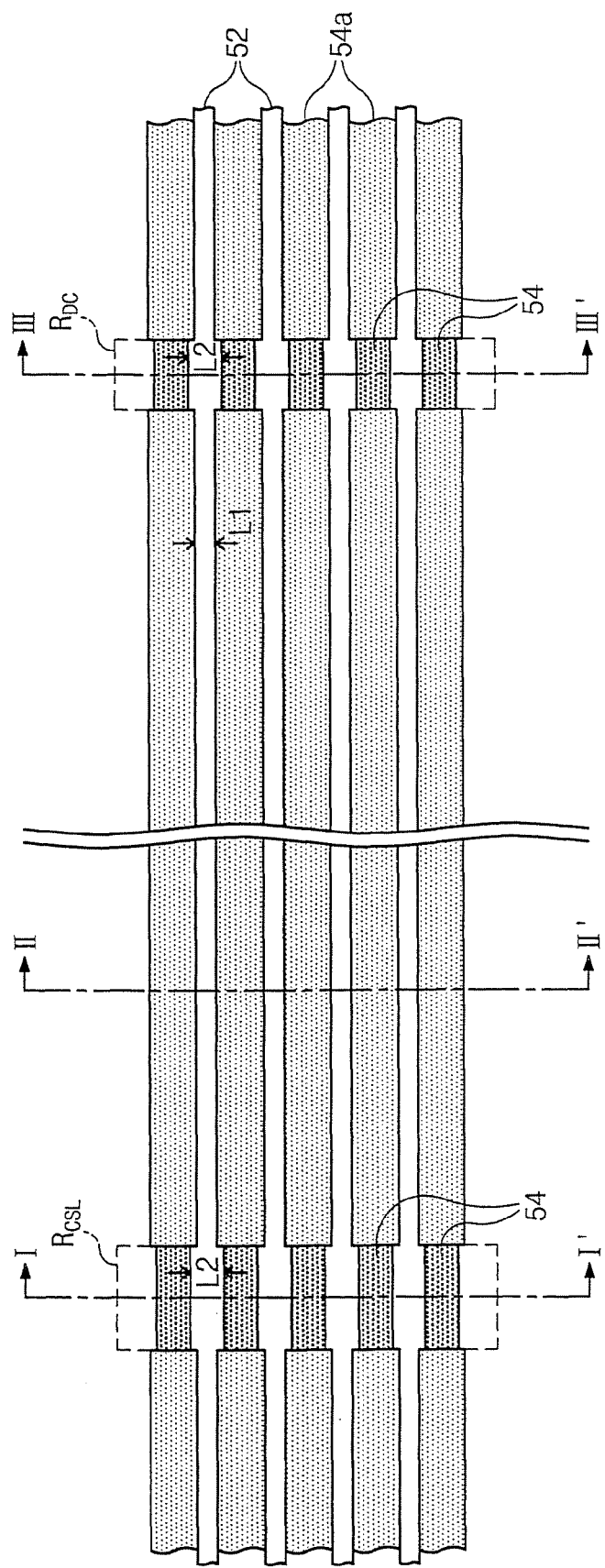
FIGS. 8A and 9A are plane views illustrating a nonvolatile memory device according to further embodiments of the present invention and methods of fabricating the same.
Figure 9A:
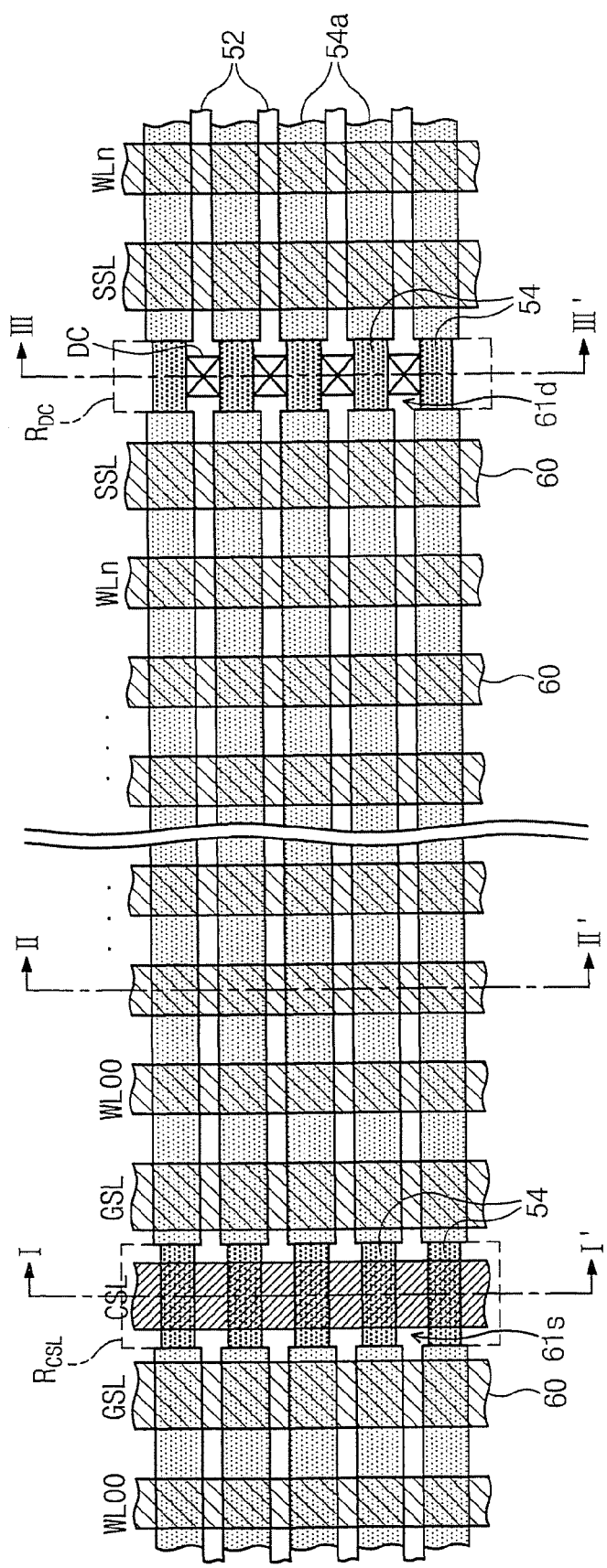

FIGS. 8A and 9A are plane views illustrating a nonvolatile memory device according to second embodiments of the present invention, and methods of fabricating the same.

Figure 8B:
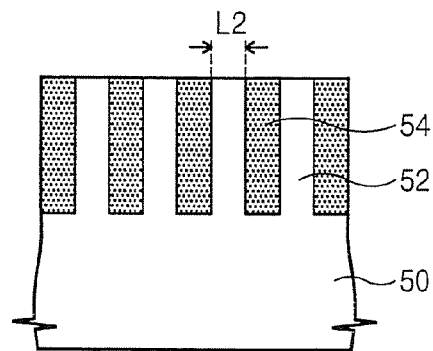
FIGS. 8B and 9B are cross-sectional views taken along the lines I-I' of FIGS. 5A and 9A, respectively.
Figure 8C:
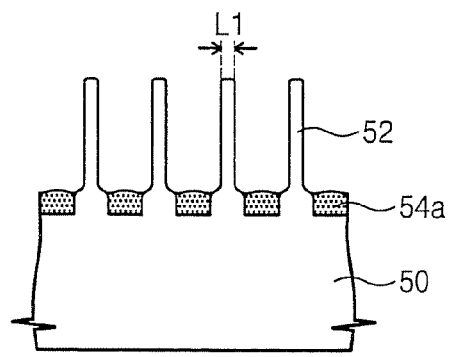
FIGS. 8C and 9C are cross-sectional views taken along the lines II-II' of FIGS. 5A and 9A, respectively.
Figure 8D:
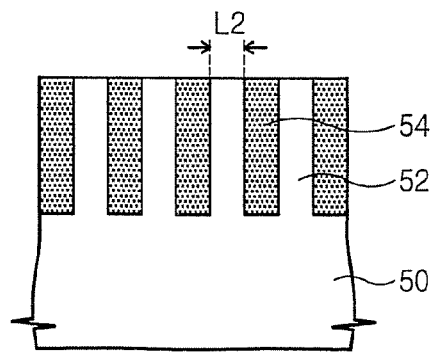
FIGS. 8D and 9D are cross-sectional views taken along the lines III-III' of FIGS. 5A and 9A, respectively.
Figure 9B:
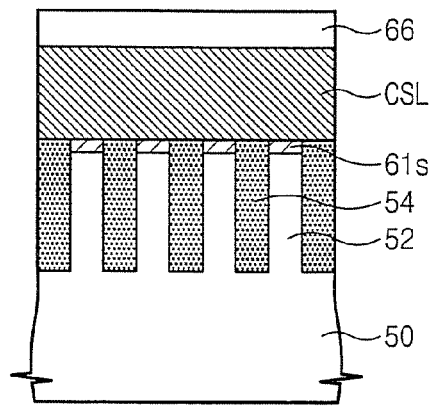
Figure 9C:
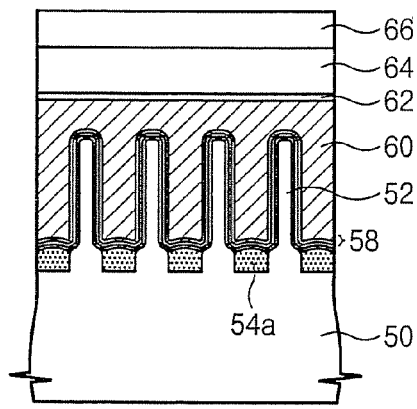
Figure 9D:
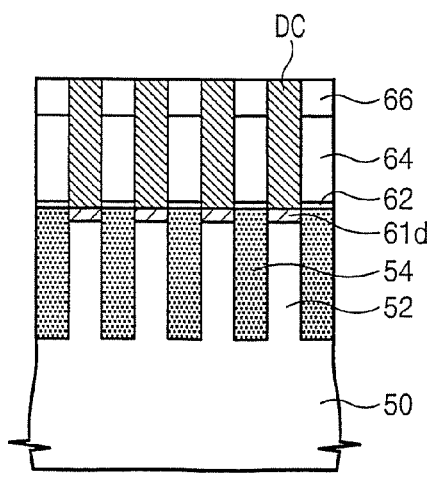
Figure 10B:
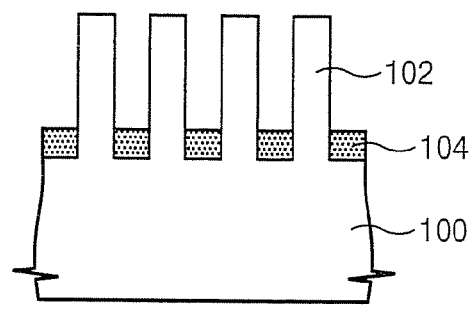
Figure 10C:
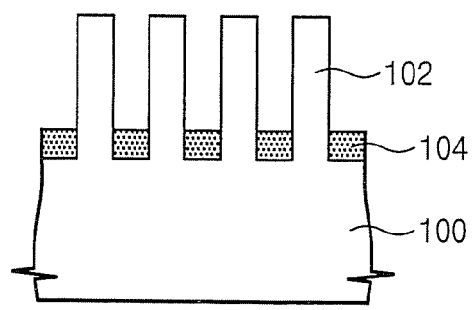
Figure 10D:
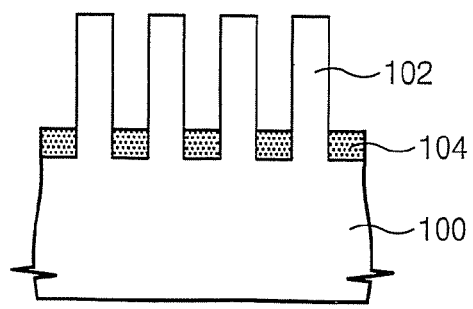
Figure 11A:
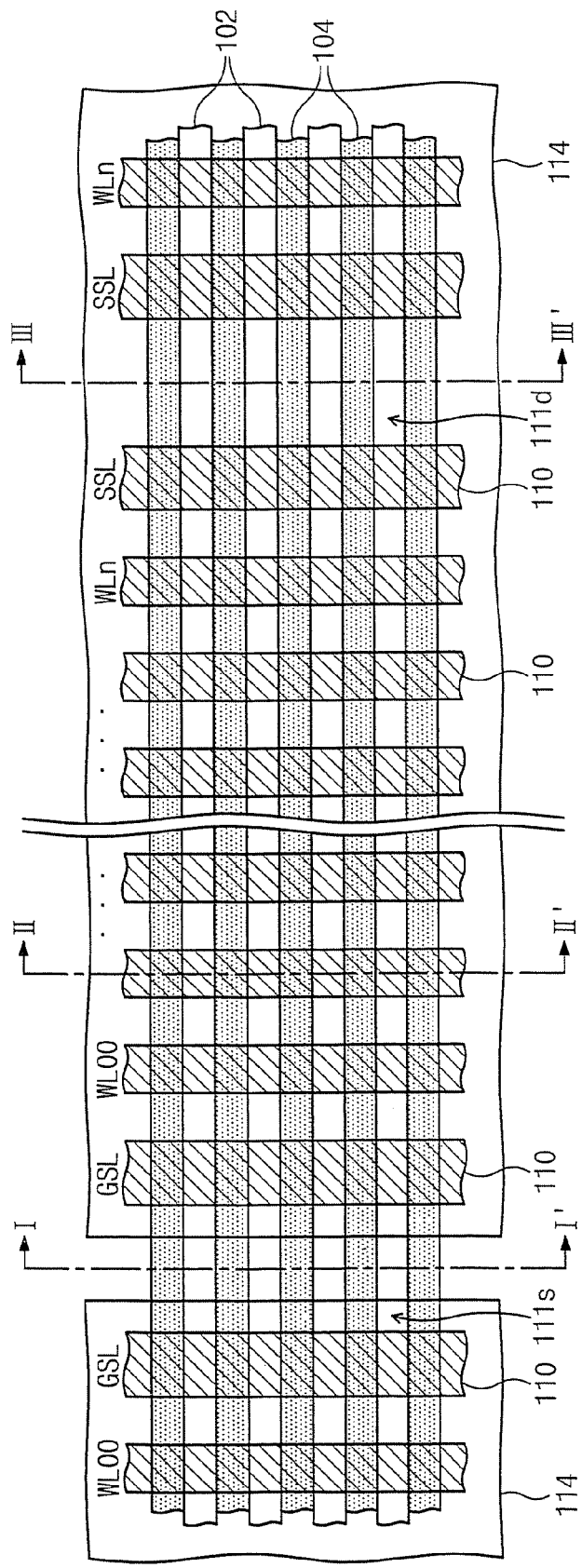
Figure 11B:
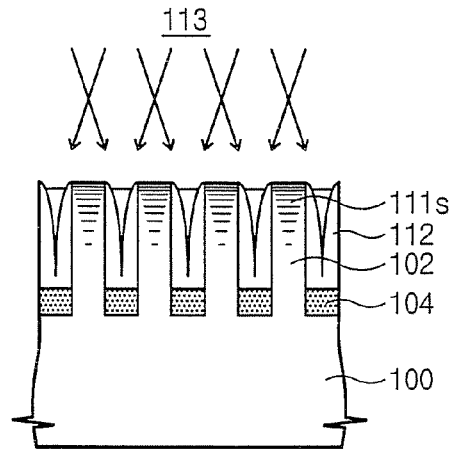
Figure 11C:
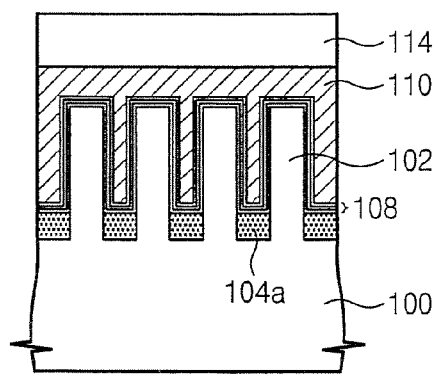
Figure 11D:
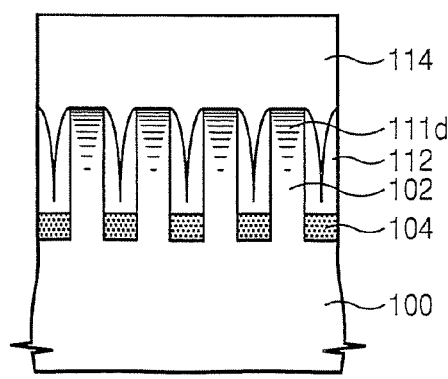
Figure 12A:
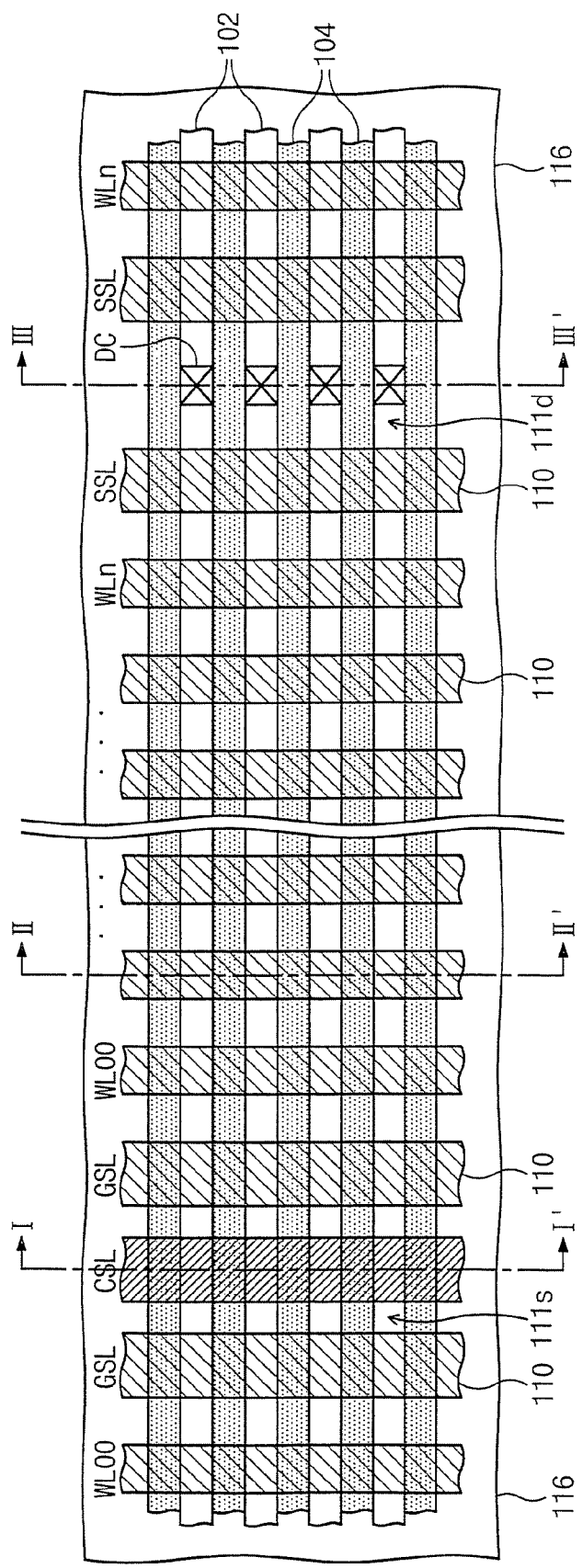
Figure 12B:
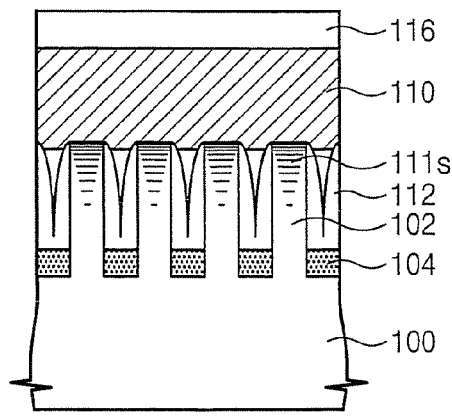
Figure 12C:
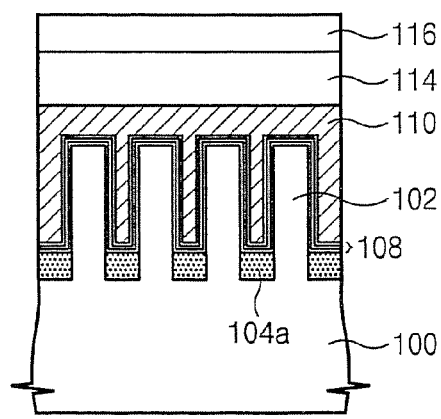
Figure 12D:
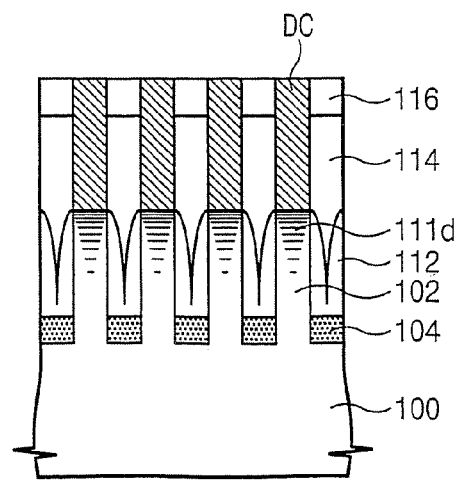

FIGS. 8B and 9B are cross-sectional views taken along the lines I-I' of FIGS. 8A and 9A, respectively. FIGS. 8C and 9C are cross-sectional views taken along the lines II-II of FIGS. 8A and 9A, respectively. FIGS. 8D and 9D are cross-sectional views taken along the lines III-III' of FIGS. 8A and 9A, respectively.

Figure 5A:
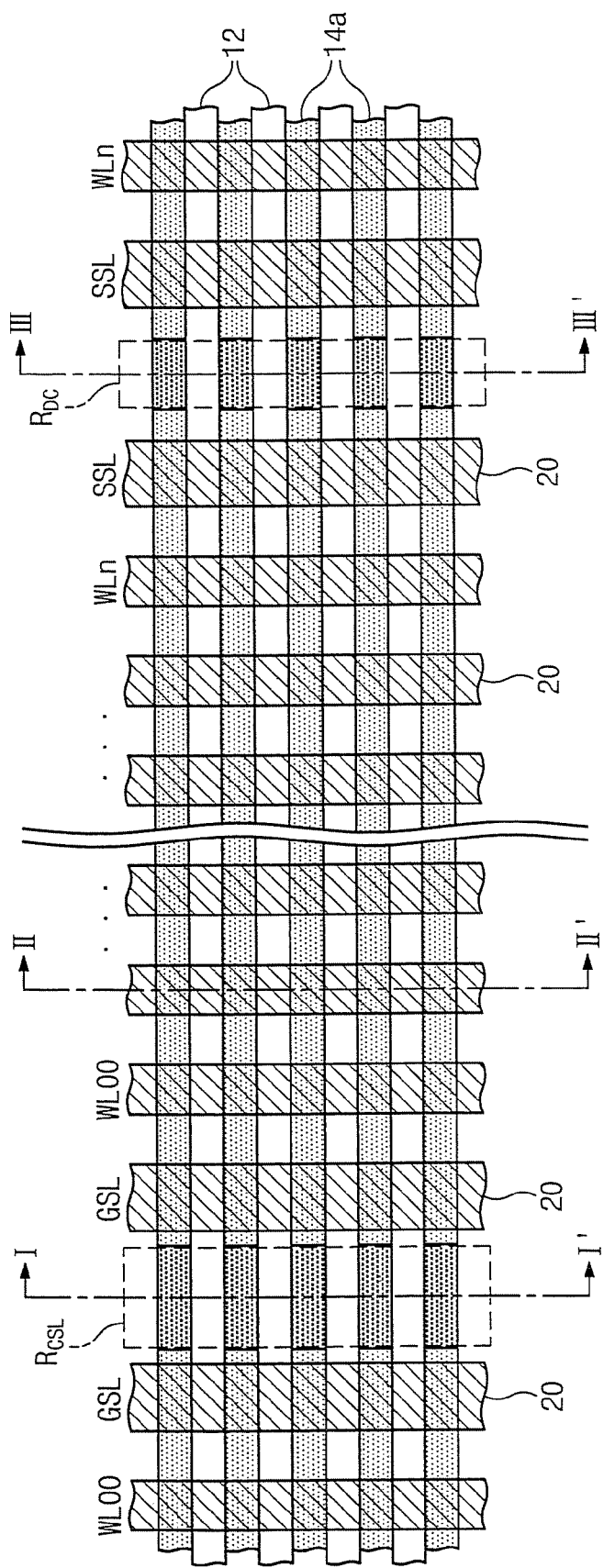
Figure 5B:
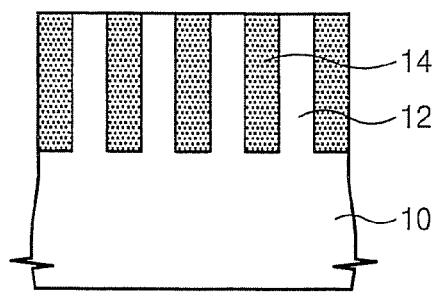
Figure 5C:
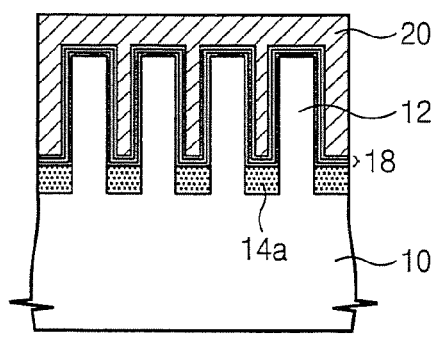
Figure 5D:
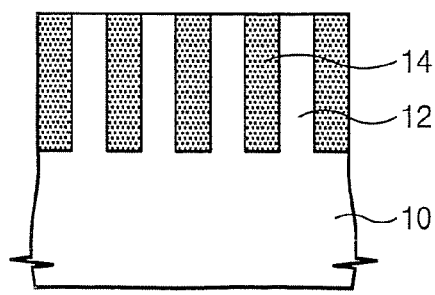
Figure 6A:
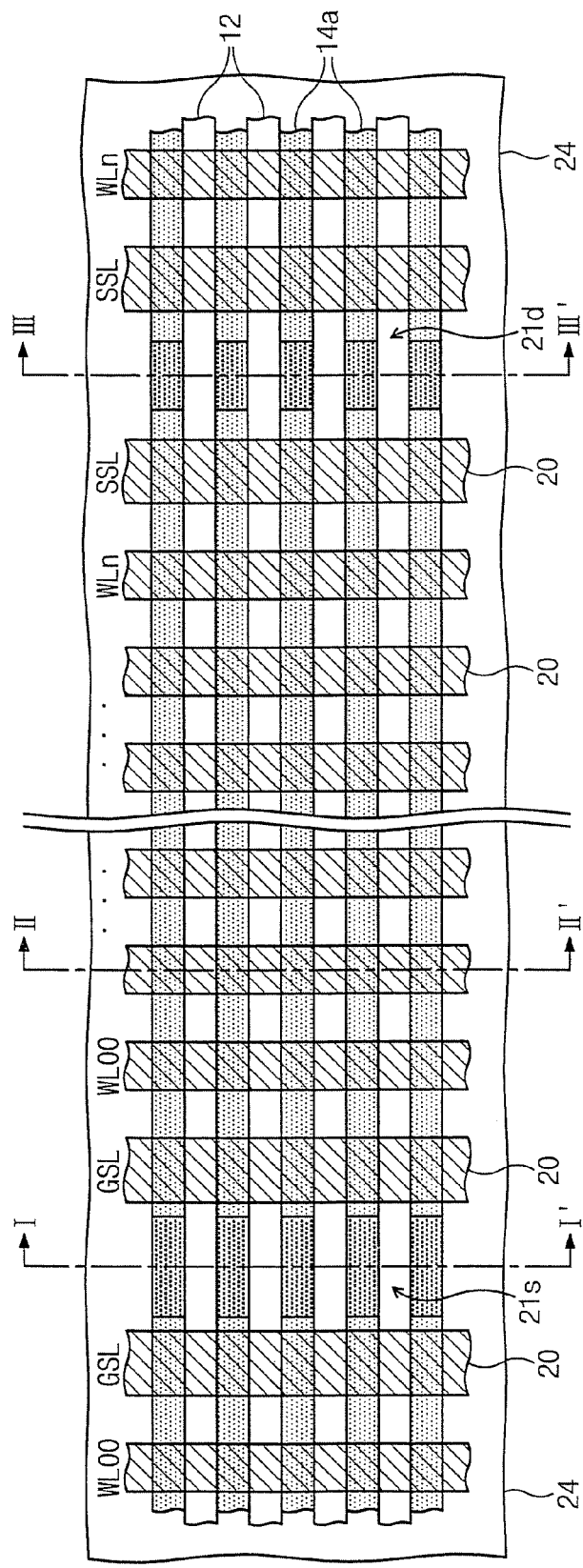
Figure 6B:
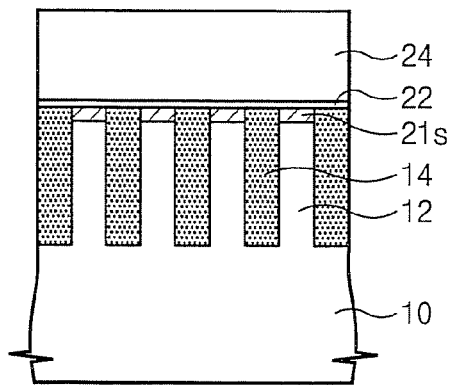
Figure 6C:
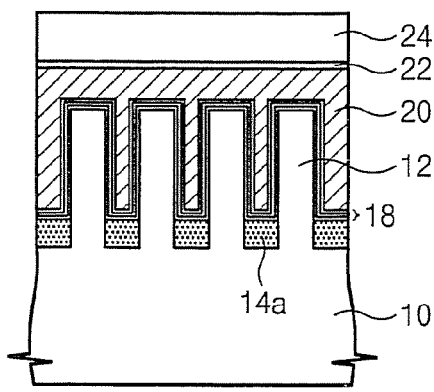
Figure 6D:
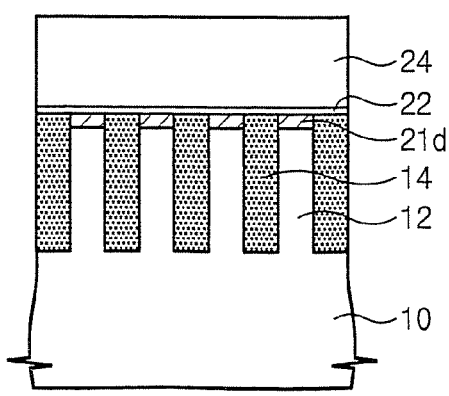
Figure 7A:
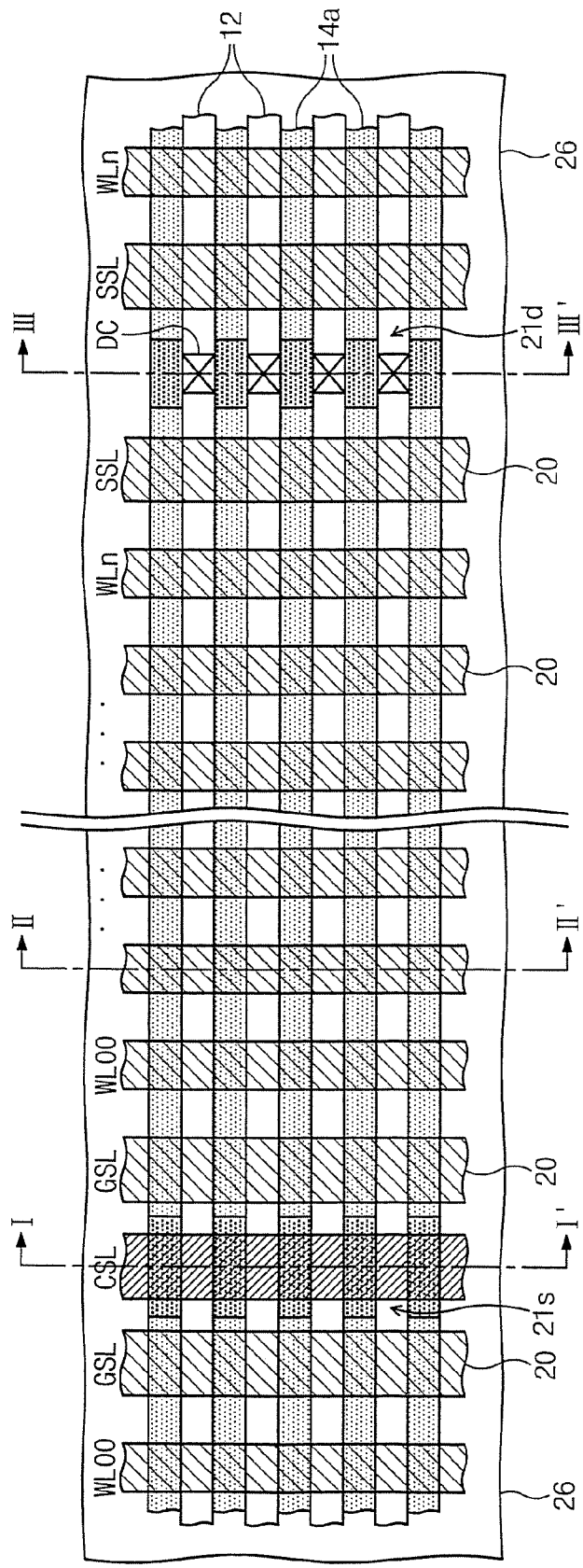
Figure 7B:
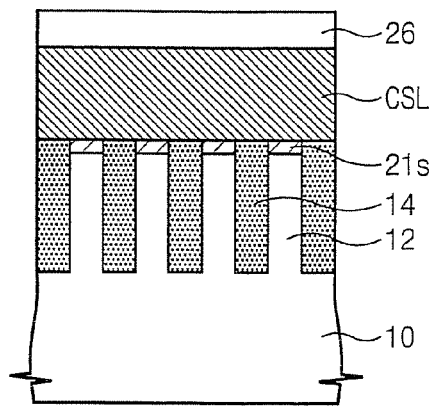
Figure 7C:
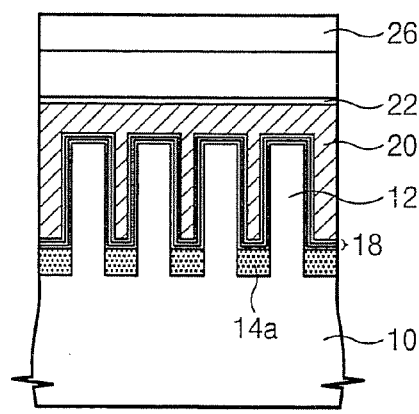
Figure 7D:
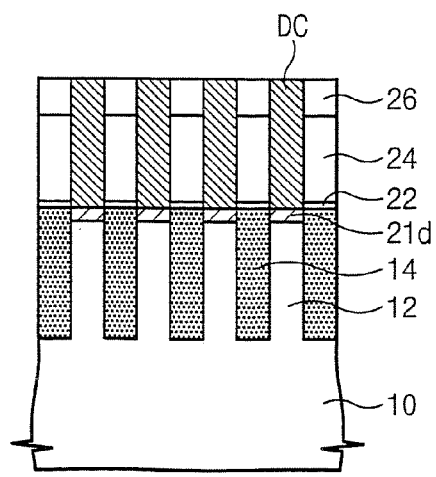

Referring to FIGS. 8A to 5D, similar to the first embodiments described above, a plurality of fin-shaped active regions 52 and a device isolation layer 54 are formed on a semiconductor substrate 50. Thereafter, a portion of the device isolation layer 54 is removed to form a low region 54a of the device isolation layer (See FIGS. 3A to 3D, and FIGS. 4A to 4D). Subsequently, a thermal oxidation process is performed on the substrate 50 to form a thermal oxide layer on the exposed sidewall of the active region 52 between the low regions 54a of the device isolation layer. Afterwards, the thermal oxide layer is removed. As a result, the active region 52 has a first width L1 between the low regions 54a of the device isolation layer, and a second width L2 between the high regions 54 of the device isolation layer, wherein the second width L2 is greater than the first width L1.

Referring to FIGS. 9A to 9D, a gate insulating layer 58 and a conductive layer 60 are formed on the active region of which the fin width is reduced. Thereafter, the conductive layer 60 is patterned to form a plurality of word lines WLn crossing over the active region 52, and select gate lines GSL and SSL. In a NAND SONOS (Silicon-Oxide-Nitride-Oxide-Silicon) memory cell, the gate insulating layer is a charge storage insulating layer 18. Impurities are implanted into the active region to form a source region 61s and a drain region 61d, wherein the source region 61s is formed on the active region 52, which is adjacent to the ground select gate line GSL and interposed between the high regions 54 of the device isolation layer, and the drain region 61d is formed on the active region 52, which is adjacent to the string select gate line SSL and interposed between the high regions 54 of the device isolation layer. An impurity diffusion layer is also formed on the active region 52 between the word lines WLn, and between the word line WLn and the select gate line SSL and GSL. The impurities may be doped into the lower portion of the active region using a tilted ion implantation process. Thereafter, an etch stop layer 62 is formed on the entire surface of the substrate 50, and a first interlayer insulating layer 64 is formed on the etch stop layer 62. The etch stop layer 62 covers the top surface of the active region 52. The source region 61s and the drain region 61d are not in contact with sidewalls of the active region because of the device isolation layer 54.

The first interlayer insulating layer 64 and the etch stop layer 62 are patterned in sequence to form a groove exposing the source region 61s. Afterwards, the groove is filled with the conductive material so that a common source line CSL is formed to electrically connect the source regions 61s to one another. In the present invention, the source regions 61s are formed in the active region interposed between the device isolation layers 54. Therefore, because the sidewall of the active region on which the source region 61s is formed is covered with the device isolation layer 54 having an etch selectivity with respect to the etch stop layer 62, the common source line CSL is not in contact with the lower sidewall of the active region where the source regions 61s are not formed or the doping concentration is low.

A second interlayer insulating layer 66 is formed on the entire surface of the substrate 50, and then the second interlayer insulating layer 66, the first interlayer insulating layer 64 and the etch stop layer 62 are etched in sequence to form a contact hole exposing the drain region 61d. Thereafter, the contact hole is filled with a conductive material to form a bit line contact DC. Because the device isolation layer 54 has an etch selectivity with respect to the etch stop layer 62, which is the lowermost layer of the interlayer insulating layer, the active regions under the drain regions 61d are not exposed due to etching of the device isolation layer even if the contact hole and the active region are misaligned with each other.

As a result, because the sidewall of the active region under the source and drain regions 61s and 61d are also protected by the device isolation layer 54, according to the second embodiments of the present invention, it is possible to prevent or reduce the charge leakage between the common source line CSL/the bit line contact DC and the substrate 50.

FIGS. 10A to 12A are plane views illustrating nonvolatile memory devices according to third embodiments of the present invention, and methods of fabricating the same.

FIGS. 10B to 12B are cross-sectional views taken along the lines I-I' of FIGS. 10A to 12A, respectively. FIGS. 10C to 12C are cross-sectional views taken along the lines II-II' of FIGS. 10A to 12A, respectively. FIGS. 10D to 12D are cross-sectional views taken along the lines III-III' of FIGS. 10A to 12A, respectively.

Referring to FIGS. 10A to 10D, similar to the first and second embodiments of the present invention described above, a fin-shaped active region 102 and a device isolation layer 104 are formed on a semiconductor substrate 100. The device isolation layer 104 is etched to expose the sidewall of the active region 102.

Referring to FIGS. 11A to 11D, a gate insulating layer 108 and a conductive layer 110 are formed on the active region 102. Thereafter, the conductive layer 102 is patterned to form a word line WLn and a select gate line SSL and GSL, wherein the word line WLn and the select gate line SSL and GSL cross over the active region 102. The gate insulating layer 108 may be formed as a multi-layered charge storage insulating layer capable of storing charges to thereby form a charge-trap type nonvolatile memory device. Impurities are implanted into the substrate 100 where the word line WLn and the select gate line SSL and GSL are formed to thereby form a source region 111s and a drain region 111d. The source region 111s is formed on the active region between the ground select lines GSL and the drain region 111d is formed on the active region between the string select lines SSL. Although a tilted ion implantation process may be used, the lower portion of the active region may have relatively low impurity concentration, or may not incorporate an impurity diffusion layer therein.

A sidewall protection layer 112 is formed on the sidewall of the active region 102. The sidewall protection layer 112 may be formed through the following operations: forming an insulating layer on the entire surface of the substrate, and anisotropically etching the insulating layer until the top surface of the active region is exposed. As illustrated in the drawings, a plurality of active regions 102, which are parallel with one another, are formed in a cell array. If a space between the active regions is narrow, then the sidewall protection layer 112 may fill the space between the active regions 102.

A first interlayer insulating layer 114 is formed on the entire surface of the semiconductor substrate 100. The first interlayer insulating layer 114 is formed of an insulating material having an etch selectivity with respect to the sidewall protection layer 112. In general, if the interlayer insulating layer is formed of a silicon oxide layer, the sidewall protection layer 112 may be a silicon nitride layer.

The first interlayer insulating layer 114 is etched to form a groove exposing the active region on which the source region 111s is formed. Inside the groove, a portion of the first interlayer insulating layer 114 may remain intact around a bottom region.

Because the sidewall protection layer is formed by means of an anisotropic etch of the insulating layer, the sidewall of the active region may be partially exposed if the insulating layer is overetched. Accordingly, an additional ion implantation 113 may be performed to increase the impurity concentration of the exposed active region in the groove.

Referring to FIGS. 12A to 12D, the groove is filled with a conductive material so as to form a common source line CSL for electrically connecting the source regions 111s to one another. A second interlayer insulating layer 116 is formed over the entire surface of the substrate 100. Thereafter, the second interlayer insulating layer 116 and the first interlayer insulating layer 114 are patterned to form a contact hole exposing the active region. The contact hole is filled with a conductive material to form a bit line contact DC, which is in contact with the drain region 111d.

In the third embodiments of the present invention, the sidewall of the active region where the source and drain regions 111s and 111d are formed is covered with the sidewall protection layer 112. Therefore, it is possible to prevent or reduce the likelihood of the common source line CSL and the bit line contact DC contacting the sidewall of the lower portion of the active region where the doping concentration of the source and drain regions 111s and 111d is low, or the source and drain regions 111s and 111d are not formed. As a result, it is possible to prevent or reduce the charge leakage between the common source line CSL/the bit line contact DC and the substrate 100.

The NAND type flash memory device may determine a program or an erase operation using 0 V as a reference voltage. It is generally known that an initial threshold voltage becomes lower when a FinFET is used in a nonvolatile memory device than when a flat transistor is used in a nonvolatile memory device. In a memory cell transistor, the threshold voltage may be controlled by the program and erase operation so that the threshold voltage is typically not a serious problem. However, if the select transistor has a negative threshold voltage, the transistor may be turned-on even though an OFF voltage is applied to the gate so that it may impossible for the memory device to operate normally.

The following fourth and fifth embodiments of the present invention may provide a structure capable of preventing or reducing the likelihood that the select transistor has a negative threshold voltage, and methods of fabricating the same.

Figure 13A:
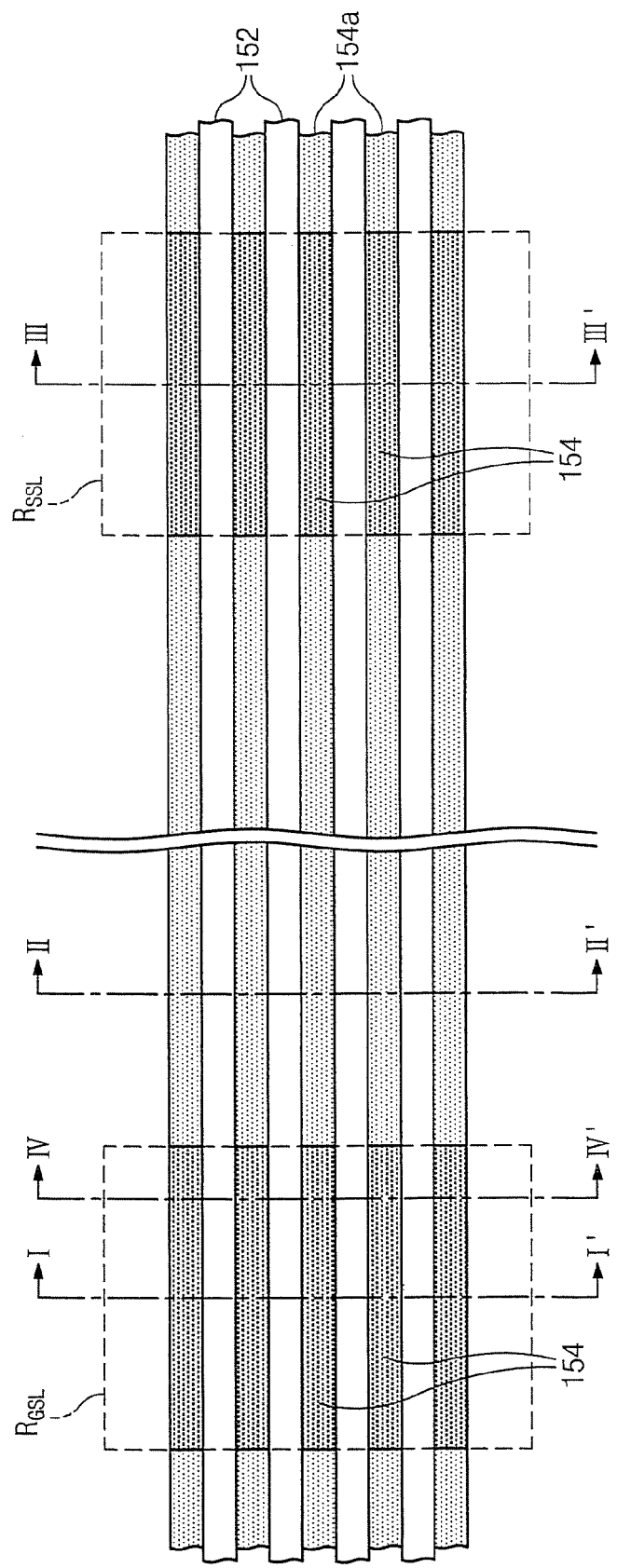
FIGS. 13A and 14A are plane views illustrating a nonvolatile memory device according to still further embodiments of the present invention and methods of fabricating the same.
Figure 14A:
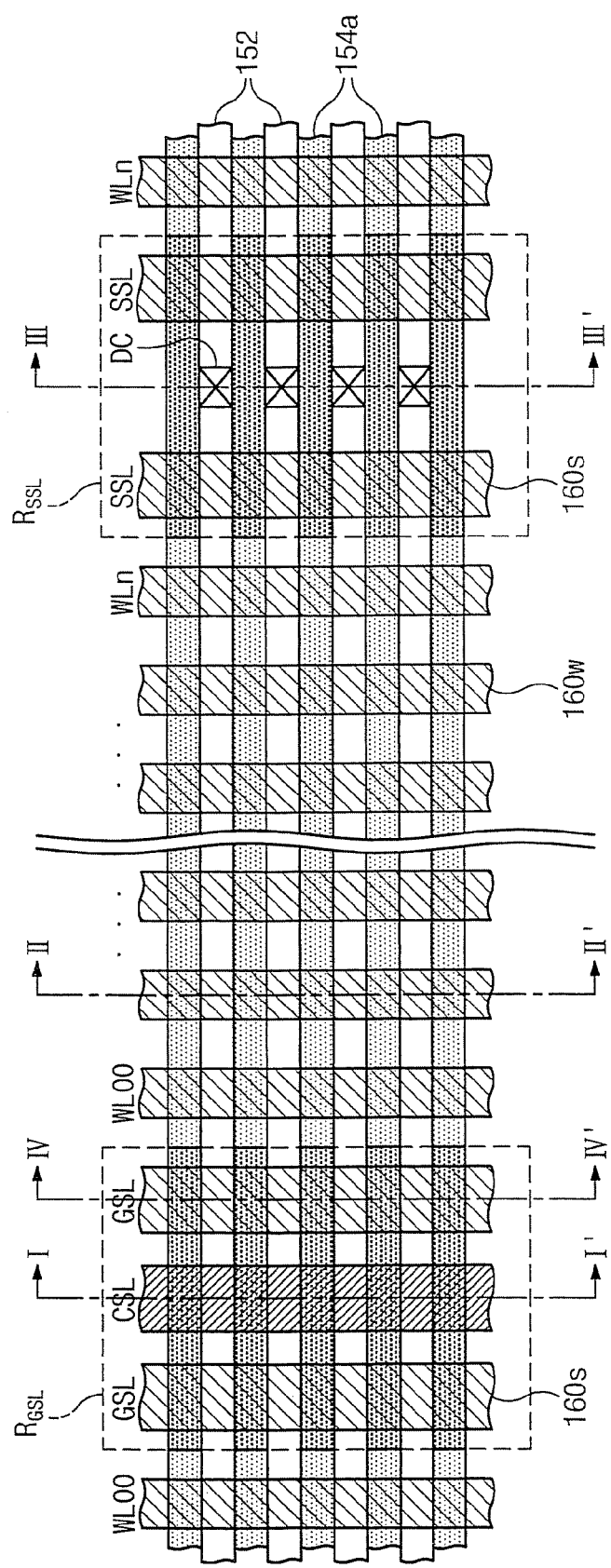

FIGS. 13A and 14A are plane views illustrating a nonvolatile memory device according to fourth embodiments of the present invention, and methods of fabricating the same.

Figure 13B:
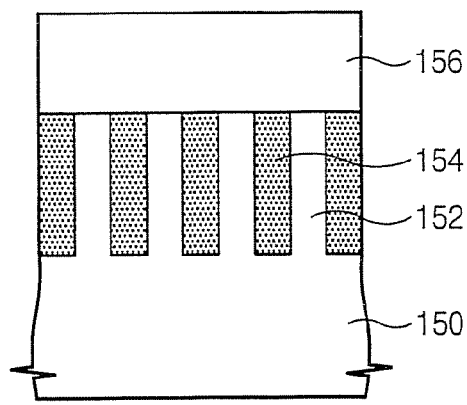
FIGS. 13B and 14B are cross-sectional views taken along the lines I-I' of FIGS. 13A and 14A, respectively.
Figure 13C:
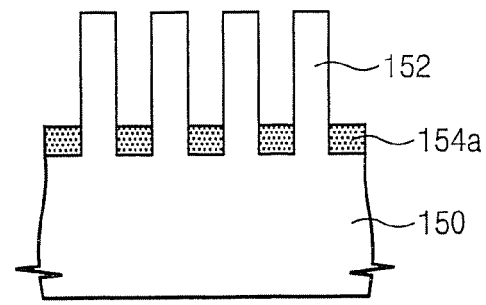
FIGS. 13C and 14C are cross-sectional views taken along the lines II-II' of FIGS. 13A and 14A.
Figure 13D:
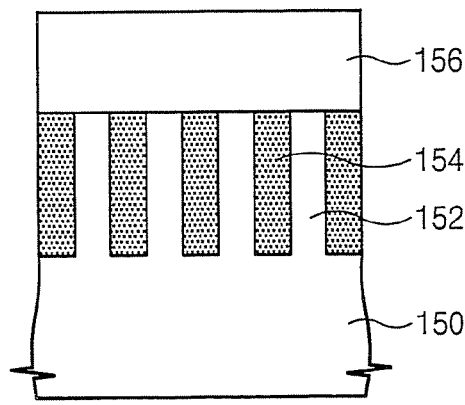
FIGS. 13D and 14D are cross-sectional views taken along the lines III-III' of FIGS. 13A and 14A, respectively.
Figure 13E:
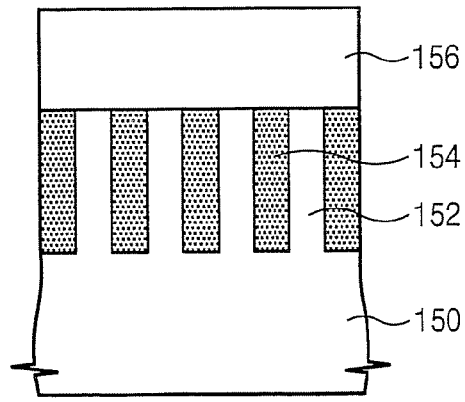
FIGS. 13E and 14E are cross-sectional views taken along the lines IV-IV' of FIGS. 13A and 14A, respectively.
Figure 14B:
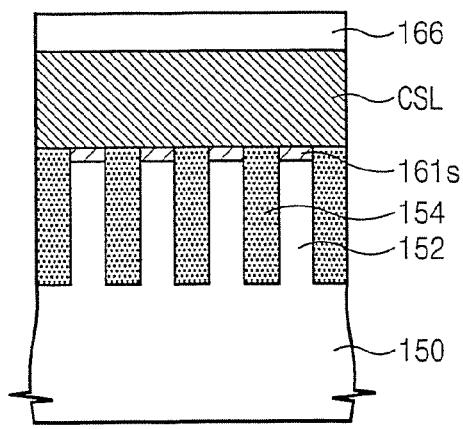
Figure 14C:
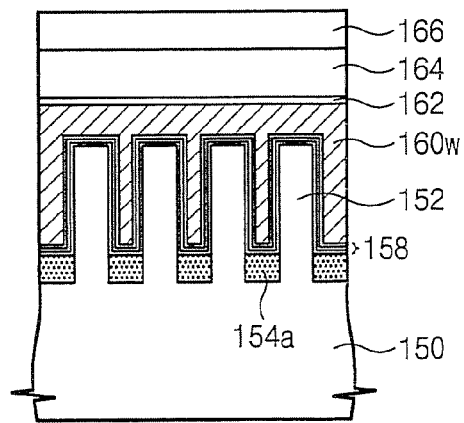
Figure 14D:
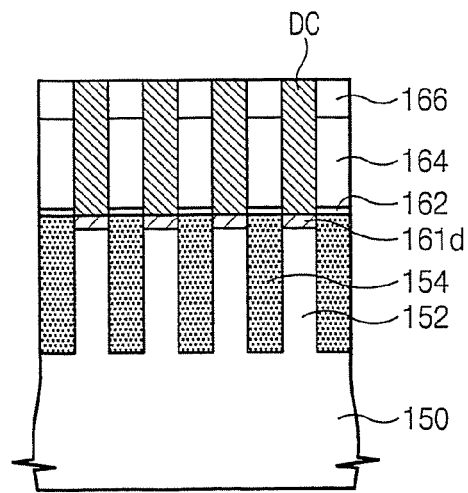
Figure 14E:
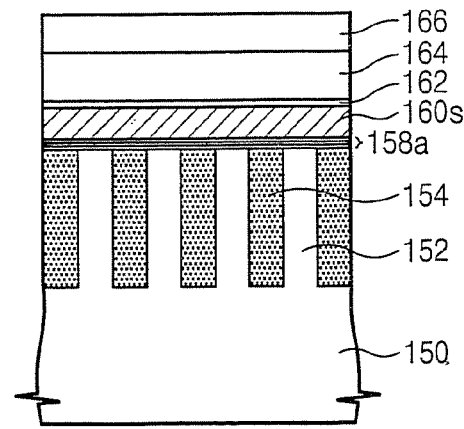

FIGS. 13B and 14B are cross-sectional views taken along the lines I-I' of FIGS. 13A and 14A, respectively. FIGS. 13C and 14C are cross-sectional views taken along the lines II-II' of FIGS. 13A and 14A. FIGS. 13D and 14D are cross-sectional views taken along the lines III-III' of FIGS. 13A and 14A, respectively. FIGS. 13E and 14E are cross-sectional views taken along the lines IV-IV' of FIGS. 13A and 14A, respectively.

Referring to FIGS. 13A to 13E, similar to the first, second, and third embodiments of the present invention discussed above, a fin-shaped active region 152 and a device isolation layer 154 are formed on a semiconductor substrate 150. A select gate region $R_{GSL}$ and $R_{SSL}$ is defined in a cell array region. The select gate region $R_{GSL}$ and $R_{SSL}$ includes one region where a ground select gate line GSL and a string select gate line SSL are formed, and another region where a common source line CSL and a bit line contact DC are formed.

A mask layer 156 is formed to cover the select gate region $R_{GSL}$ and $R_{SSL}$, and the device isolation layer 154 is etched using the mask layer 156 as an etch mask. As a result, the device isolation layer is divided into a high region 154 and a low region 154a. Therefore, the sidewall of the active region 152 is covered with the device isolation layer 154 in the select gate region $R_{GSL}$ and $R_{SSL}$, whereas the sidewall of the active region between the low regions 154a of the device isolation layer is partially exposed in other regions except the select gate region $R_{GSL}$ and $R_{SSL}$. The device isolation layer remaining at the low region 154a may have an appropriate thickness based on the channel width of a transistor and a parasitic transistor formed under the device isolation layer.

Referring to FIGS. 14A to 14E, a gate insulating layer 158 and 158a is formed on the active region, and a word line WLn and a select gate line SSL and GSL are formed over the gate insulating layer 158 and 158a, wherein the word line WLn and the select gate line SSL and GSL cross over the active region 152. The word line WLn has a surface opposite to the sidewall of the active region, and crosses over the active region. The bottom surface of the select gate line SSL and GSL is disposed as high as or higher than the top surface of the active region 152 and it crosses over the active region.

Subsequently, a source region 161s and a drain region 161d are formed in the active region, and the etch stop layer 162 and the first interlayer insulating layer 164 are formed on the entire surface of the substrate 150. A common source line CSL is formed for electrically connecting the source regions 162s to one another, wherein the common source line CSL is formed such that it penetrates through the first interlayer insulating layer 164 and the etch stop layer 162. Thereafter, a second interlayer insulating layer 166 is formed. A bit line contact DC is formed that penetrates through the second interlayer insulating layer 166, the first interlayer insulting layer 164, and the etch stop layer 162, wherein the bit line contact DC is connected to the drain region 161d.

In the fourth embodiments of the present invention, the ground select gate line GSL and the string select gate line SSL are formed in the region where the sidewall of the active region is not exposed. Therefore, the select transistor of the NAND type cell string is formed as a flat transistor so that it is possible to prevent or reduce the likelihood that the select transistor has a negative threshold voltage. In addition, similar to the embodiments of the present invention discussed above, it may be possible to prevent or reduce the charge leakage caused by the common source line CSL/the bit line contact DC being undesirably connected to the substrate 150 under the source and drain regions 161s and 161d.

Figure 15A:
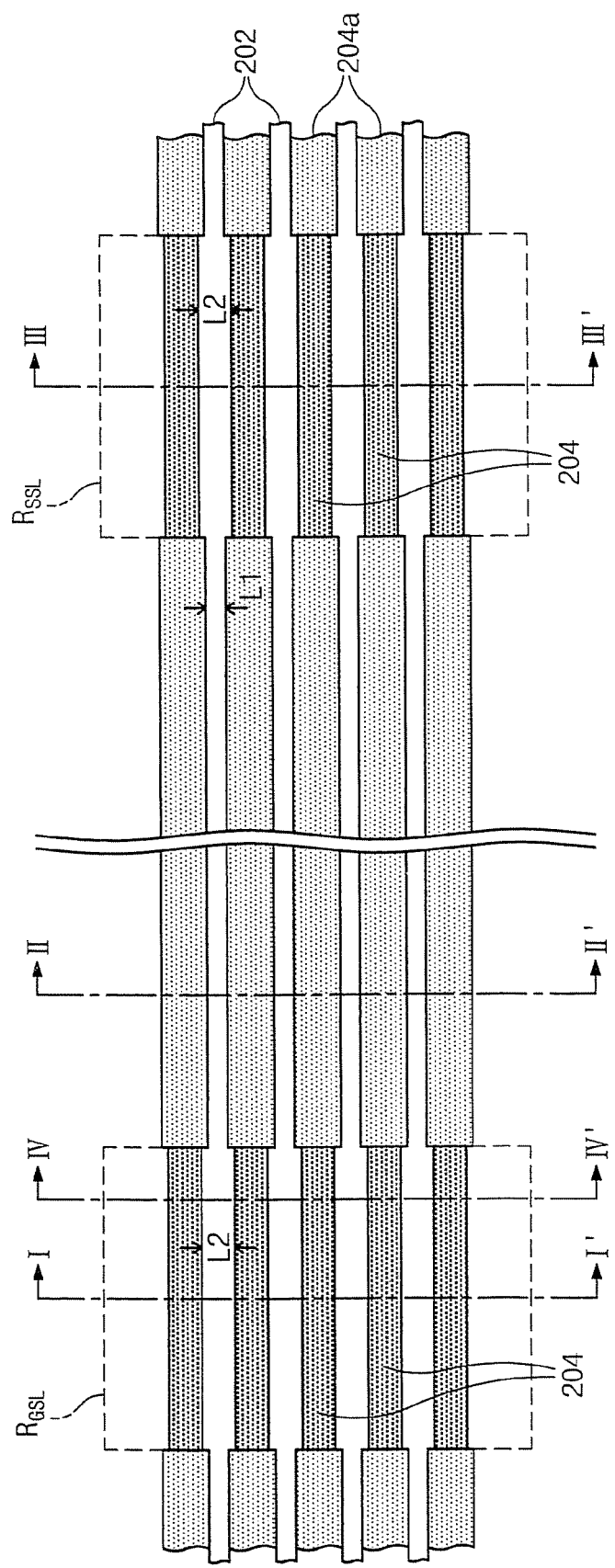
FIGS. 15A and 16A are plane views illustrating a nonvolatile memory device according to still further embodiments of the present invention and methods of fabricating the same.
Figure 16A:
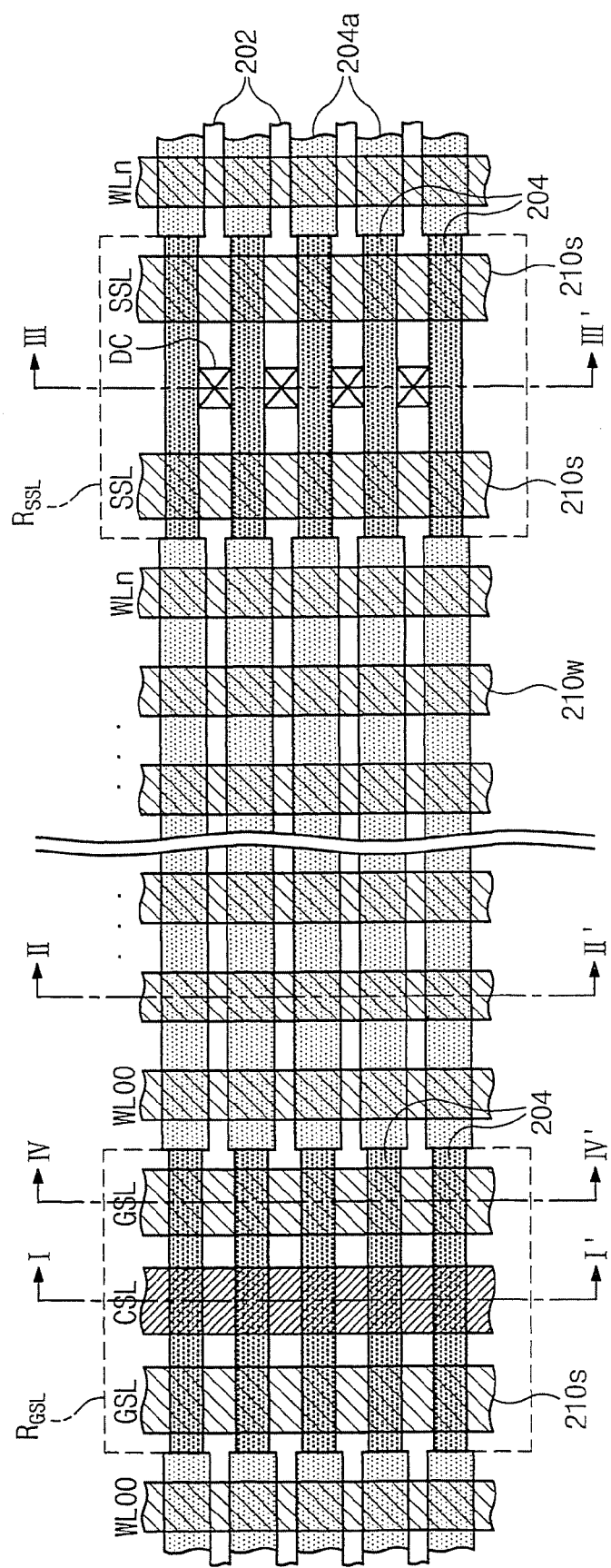

FIGS. 15A and 16A are plane views illustrating a nonvolatile memory device according to fifth embodiments of the present invention, and methods of fabricating the same.

Figure 15B:
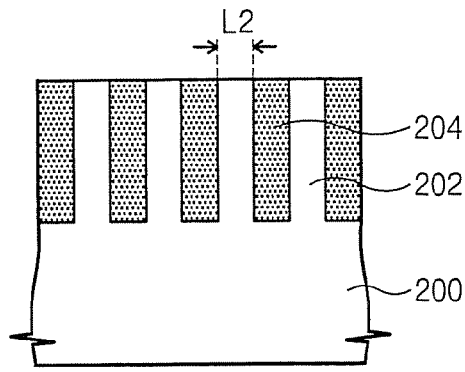
FIGS. 15B and 16B are cross-sectional views taken along the lines I-I' of FIGS. 15A and 16A, respectively.
Figure 15C:
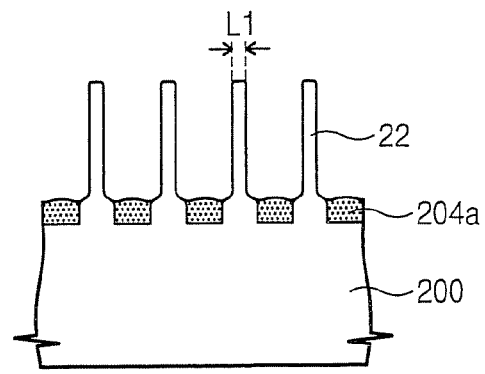
FIGS. 15C and 16C are cross-sectional views taken along the lines II-II' of FIGS. 15A and 16A, respectively.
Figure 15D:
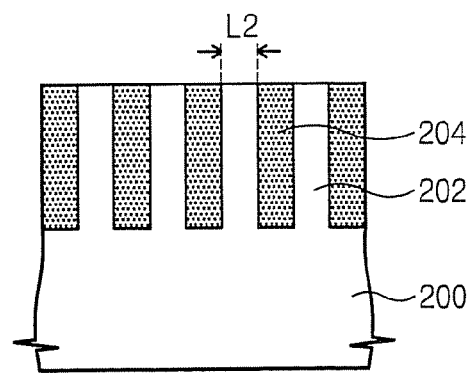
FIGS. 15D and 16D are cross-sectional views taken along the lines III-III' of FIGS. 15A and 16A.
Figure 15E:
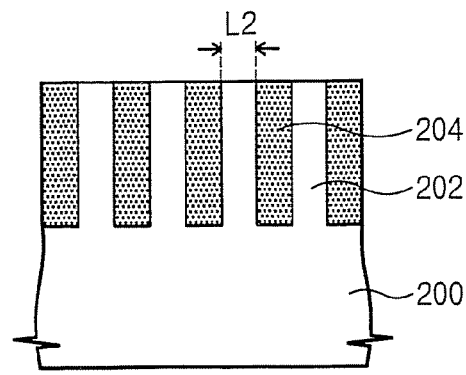
FIGS. 15E and 16E are cross-sectional views taken along the lines IV-IV' of FIGS. 15A and 16A, respectively.
Figure 16B:
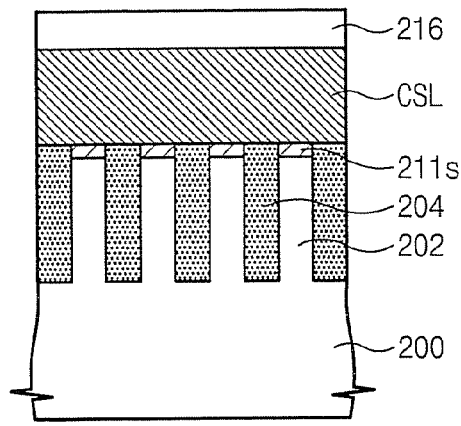
Figure 16C:
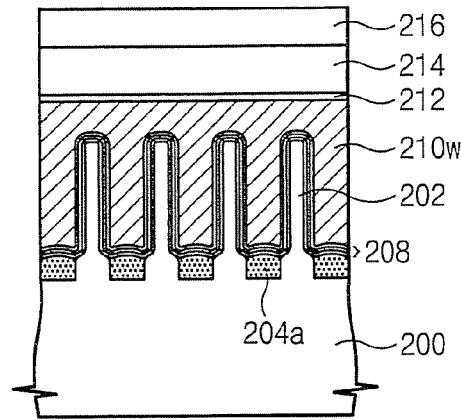
Figure 16D:
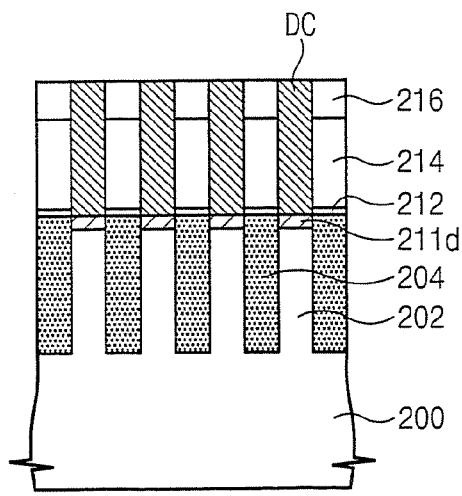
Figure 16E:
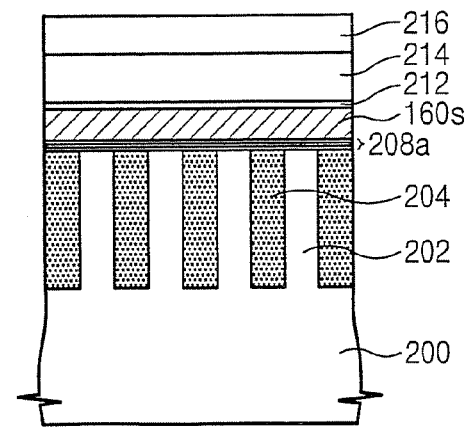

FIGS. 15B and 16B are cross-sectional views taken along the lines I-I' of FIGS. 15A and 16A, respectively. FIGS. 15C and 16C are cross-sectional views taken along the lines II-II' of FIGS. 15A and 16A, respectively. FIGS. 15D and 16D are cross-sectional views taken along the lines III-III' of FIGS. 15A and 16A. FIGS. 15E and 16E are cross-sectional views taken along the lines IV-IV' of FIGS. 15A and 16A, respectively.

The nonvolatile memory device of the fifth embodiments of the present invention may enhance the controllability of the gate electrode with respect to the channel of the transistor by reducing the width of the fin under the word line as compared to the fourth embodiments of the present invention. Referring to FIGS. 15A to 15E, a fin-shaped active region 202 and a device isolation layer 204 are formed on a semiconductor substrate 200. The device isolation layer 204 of other cell regions except a select gate region $R_{GSL}$ and $R_{SSL}$ is partially etched to expose the sidewall of the active region 202. Thereafter, a thermal oxidation is performed to form a thermal oxide layer (not shown) on the exposed sidewalls of the active region. The thermal oxide layer is removed to reduce the width of the active region. Meanwhile, similar to the embodiments of the present invention discussed above, the active region 202 has a low region and a high region. In more detail, the active region 202 between the low regions has a first width L1, and the active region 202 between the high region of the device isolation layer 204 has a second width L2, wherein the second width L2 is greater than the first width L1.

Referring to FIGS. 16A to 16E, a charge storage layer is formed on the active region 202 as a gate insulating layer 208 and 208a, and a word line WLn and a select gate line SSL and GSL are formed over the gate insulating layer 208 and 208a, which cross over the active region 202. The word line WLn has a surface opposite to the sidewall of the active region 202, and the select gate line SSL and GSL crosses over the active region interposed between the high regions 204 of the device isolation layer. The bottom surface of the select gate line SSL and GSL may be disposed as high as or higher than the top surface of the active region.

Figure 17A:
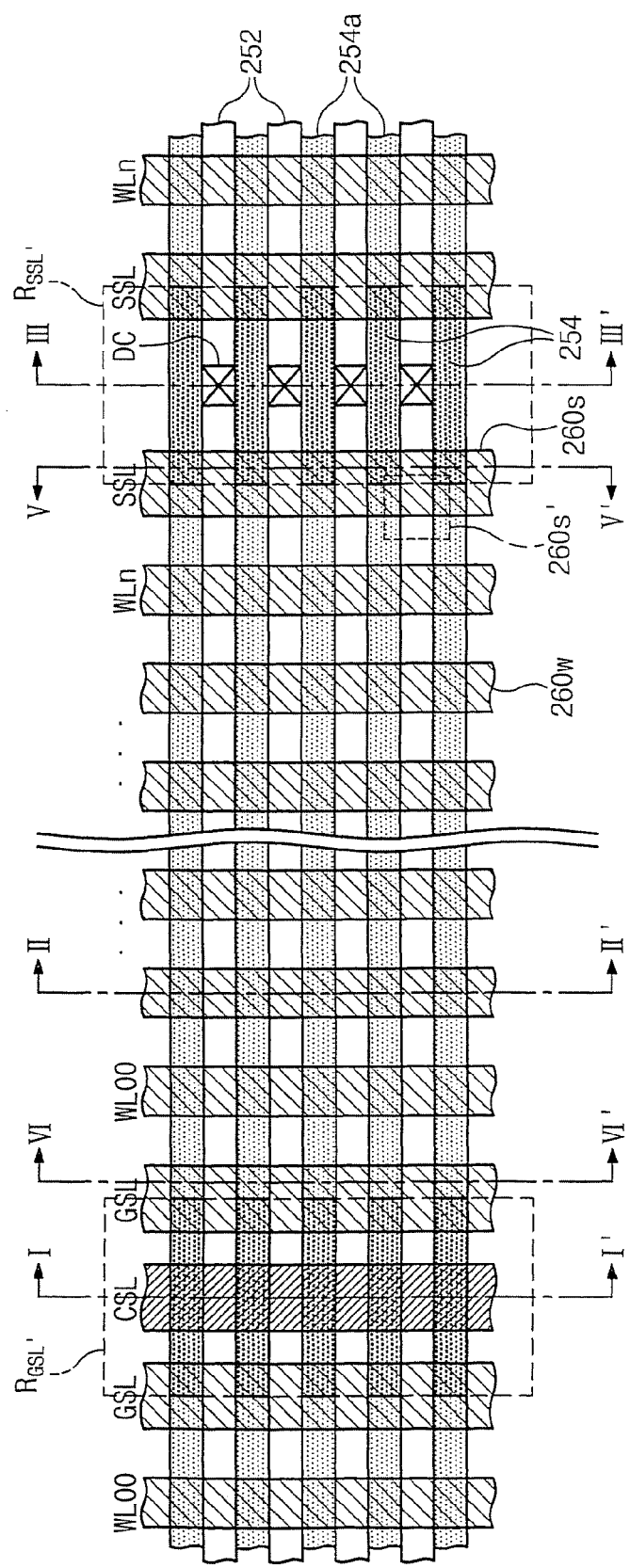
FIG. 17A is a plane view illustrating a nonvolatile memory device according to still further embodiments of the present invention and methods of fabricating the same.

FIG. 17A is a plane view illustrating a nonvolatile memory device according to sixth embodiments of the present invention, and methods of fabricating the same.

Figure 17B:
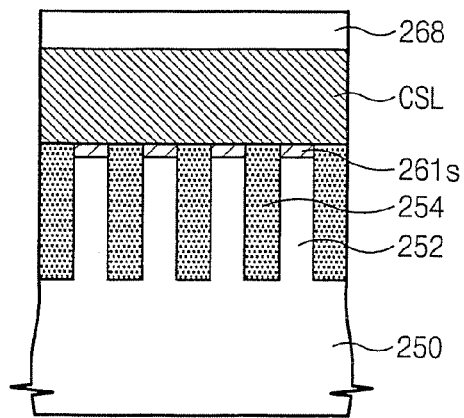
FIG. 17B is a cross-sectional views taken along the line I-I' of FIG. 17A.
Figure 17C:
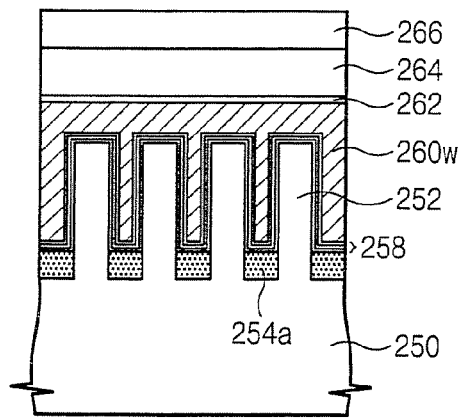
FIG. 17C is a cross-sectional views taken along the line II-II' or IV-IV' of FIG. 17A.
Figure 17D:
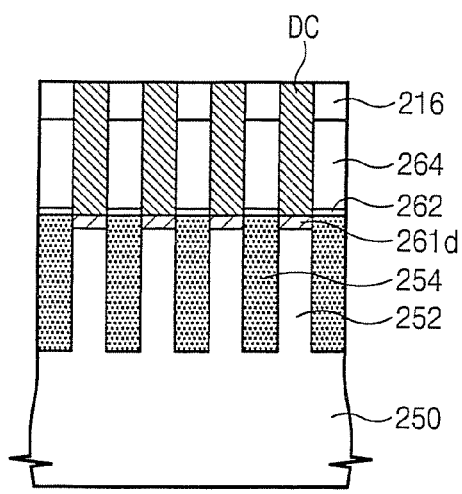
FIG. 17D is a cross-sectional views taken along the line III-III' of FIG. 17A.
Figure 17E:
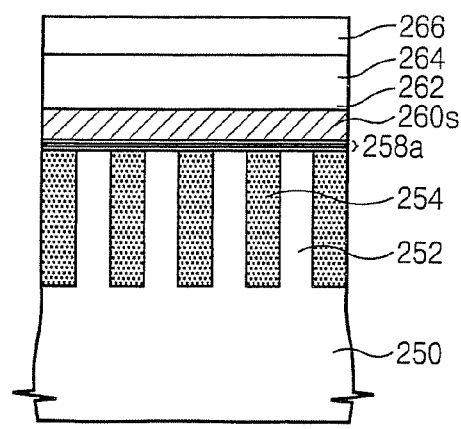
FIG. 17E is a cross-sectional views taken along the line V-V' of FIG. 17A.

FIG. 17B is a cross-sectional views taken along the line I-I' of FIG. 17A. FIG. 17C is a cross-sectional views taken along the line II-II' or IV-IV' of FIG. 17A. FIG. 17D is a cross-sectional views taken along the line III-III' of FIG. 17A. FIG. 17E is a cross-sectional views taken along the line V-V' of FIG. 17A.

Referring, to FIGS. 17A to 17E, a select gate region $R_{GSL}'$ and $R_{SSL}'$ is defined such that it overlaps with a select gate line, according to the sixth embodiment. A fin-shaped active region 252 and a device isolation layer 254 are formed over a semiconductor substrate 250. The device isolation layer 254 is partially etched to form a high region 254 and a low region 254a. In the sixth embodiments of the present invention, the select gate line SSL and GSL are formed such that it overlaps with the low region 254a and high region 254 of the device isolation layer 254. The word line WLn has a surface opposite to the sidewall of the active region and formed of a conductive pattern 260w. One portion 260s' of the select gate line SSL and GSL also has a surface opposite to the sidewall of the active region and crosses over the active region. Meanwhile, the other regions 260s, which cross over the active region, are not opposite to the sidewall of the active region.

Figure 18A:
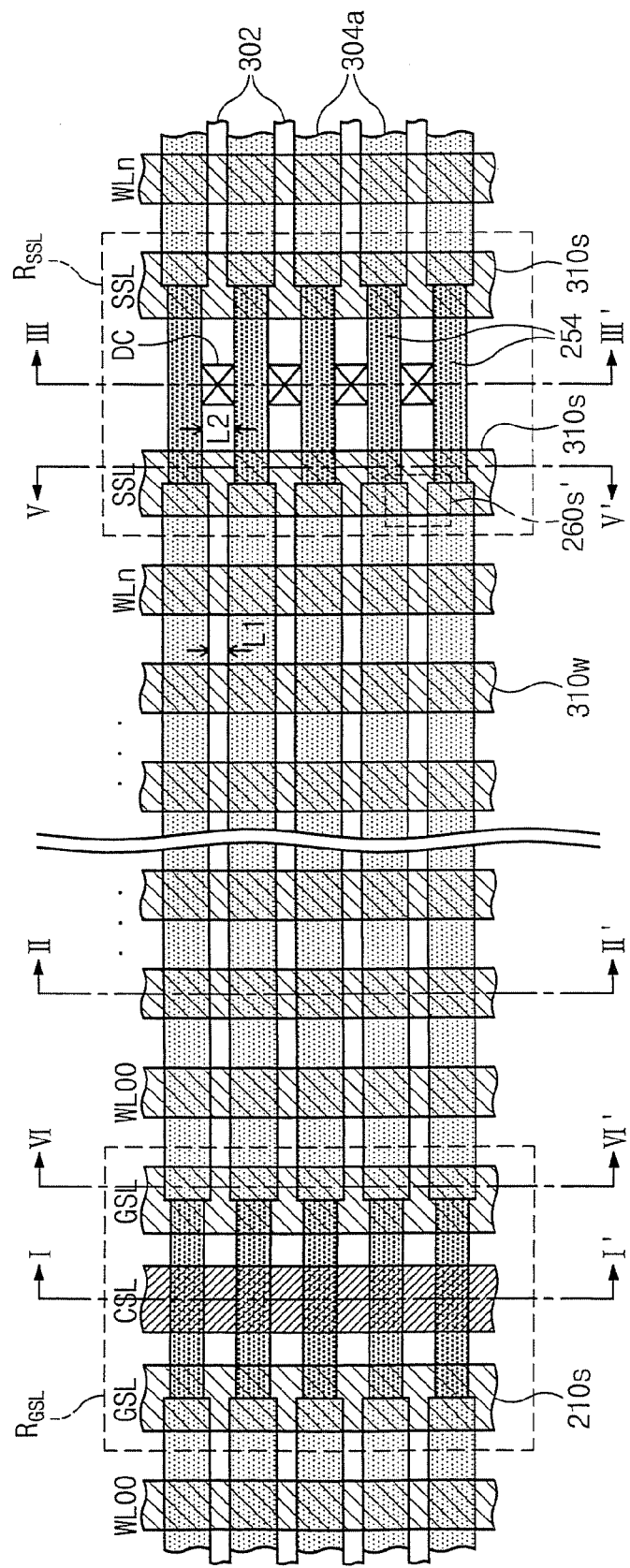
FIG. 18A is a plane view illustrating a nonvolatile memory device according to still further embodiments of the present invention and methods of fabricating the same.

FIG. 18A is a plane view illustrating a nonvolatile memory device according to seventh embodiments of the present invention, and methods of fabricating the same.

Figure 18B:
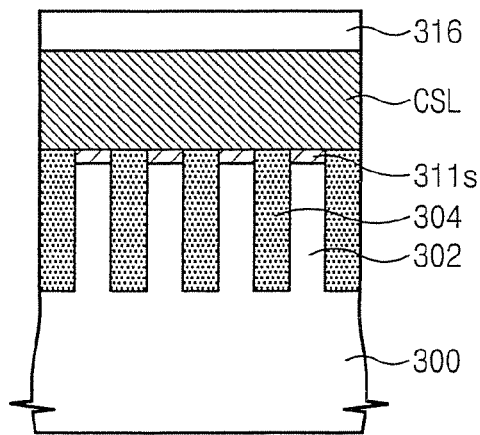
FIG. 18B is a cross-sectional views taken along the line I-I' of FIG. 18A.
Figure 18C:
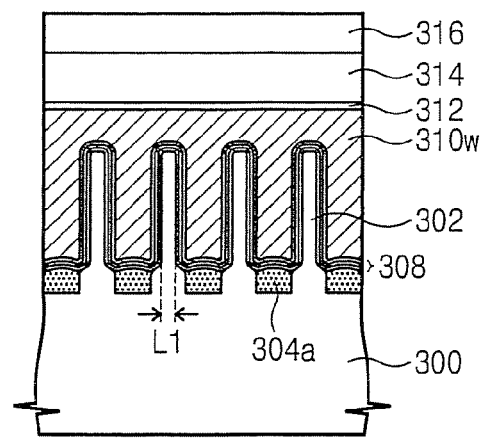
FIG. 18C is a cross-sectional views taken along the line II-II' or IV-IV' of FIG. 18A.
Figure 18D:
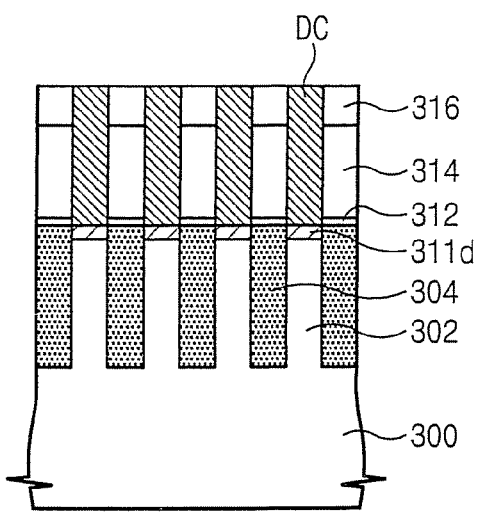
FIG. 18D is a cross-sectional views taken along the line III-III' of FIG. 18A.
Figure 18E:
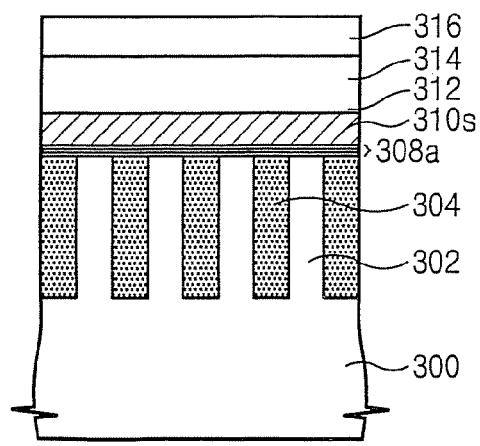
FIG. 18E is a cross-sectional views taken along the line V-V' of FIG. 18A.

FIG. 18B is a cross-sectional views taken along the line I-I' of FIG. 18A;

FIG. 18C is a cross-sectional views taken along the line II-II' or IV-IV' of FIG. 18A. FIG. 18D is a cross-sectional views taken along the line III-III' of FIG. 18A. FIG. 18E is a cross-sectional views taken along the line V-V' of FIG. 18A.

Referring to FIGS. 18A to 18E, the seventh embodiments of the present invention are related to a semiconductor device in which the first width L1 of the active region having an exposed sidewall between low regions 304a of the device isolation layer is less than the second width L2 of the active region interposed between high regions 304 of the device isolation layer.

As illustrated in the drawings, one portion of a select gate line SSL and GSL overlaps with the active region having the first width L1, and another portion thereof overlaps with the active region having the second width L2. Therefore, because a portion of the select transistor has a flat transistor structure in the NAND type cell array, the select transistor may have a positive threshold voltage.

As described above, some embodiments of the present invention may provide a nonvolatile memory device having a structure in which a channel of a cell transistor uses sidewalls of a fin-shaped active region and the leakage current of source and drain regions can also be suppressed when a fin field effect transistor (FinFET) structure is used in a nonvolatile memory device.

A sidewall protection layer is formed on the sidewall of the active region where the source and drain regions connected to an interconnection layer are formed. Therefore, it is possible to prevent or reduce the likelihood that the interconnection layer is undesirably connected to the substrate disposed under the source and drain regions when etching the interlayer insulating layer and forming the interconnection layer in contact with the source and drain regions.

In addition, when using a FinFET structure in a NAND type cell array, the cell transistor is formed in the FinFET structure and the select transistor is formed in the flat structure so that it is possible to prevent or reduce the likelihood that the select transistor has a negative threshold voltage.

Furthermore, it may be possible to enhance the controllability of the gate electrode with respect to the channel by reducing the width of the active region where the cell transistor is formed. Also, it may be possible to reduce the capacitance of the channel by forming a fully depleted channel or a complete inversion channel. This may provide an advantageous structure capable of increasing a program blocking effect by intensifying self-boosting of an unselected cell string in an operation of a NAND type nonvolatile memory device.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A nonvolatile memory device, comprising:
   a semiconductor substrate;
   a device isolation layer on the semiconductor substrate;
   a fin-shaped active region formed between portions of the device isolation layer;
   a select gate line and a word line that cross over the active region, each of the select gate line and the word line having a surface opposite to a sidewall of the active region;
   source and drain regions formed in the active region;
   a sidewall protection insulating layer formed on the sidewall of the active region in which the source and drain regions are formed, the sidewall protection insulating layer being formed on the device isolation layer; and
   an interlayer insulating layer that covers the active region and the sidewall protection insulating layer,
   wherein the sidewall protection insulating layer has an etch selectivity with respect to the interlayer insulating layer;
   wherein a top surface of the active region, in which the source and drain regions are formed, is in contact with the interlayer insulating layer; and
   wherein the sidewall of the active region is in contact with the sidewall protection insulating layer.

2. A nonvolatile memory device, comprising:
   a semiconductor substrate;
   a device isolation layer on the semiconductor substrate;
   a fin-shaped active region formed between portions of the device isolation layer;
   a select gate line and a word line that cross over the active region, each of the select gate line and the word line having a surface opposite to a sidewall of the active region;
   source and drain regions formed in the active region;
   a sidewall protection insulating layer formed on the sidewall of the active region in which the source and drain regions are formed, the sidewall protection insulating layer being formed on the device isolation layer;
   an interlayer insulating layer that covers the active region and the sidewall protection insulating layer;
   a common source line that is in contact with the source region and the device isolation layer, wherein the common source line crosses over the active region; and
   a contact pattern that is in contact with the drain region
   wherein the sidewall protection insulating layer has an etch selectivity with respect to the interlayer insulating layer.

3. The nonvolatile memory device of claim 2, further comprising a charge storage insulating layer interposed between the word line and the active region.

4. A memory device, comprising:
   a semiconductor substrate;
   a device isolation layer in the semiconductor substrate;
   a fin-shaped active region extending between portions of the device isolation layer;
   a word line extending over the fin-shaped active region;
   source and drain regions in the fin-shaped active region;
   a sidewall protection insulating layer extending on a sidewall of the fin-shaped active region; and
   an interlayer insulating layer that covers the fin-shaped active region and the sidewall protection insulating layer;
   wherein the sidewall protection insulating layer has an etch selectivity with respect to the interlayer insulating layer;
   wherein a top surface of the fin-shaped active region, in which the source and drain regions are formed, is in contact with the interlayer insulating layer; and
   wherein the sidewall of the fin-shaped active region is in contact with the sidewall protection insulating layer.

5. The memory device of claim 4, further comprising:
   a common source line that crosses over the fin-shaped active region and is in contact with the source region and the device isolation layer; and
   a contact pattern in contact with the drain region.

6. The memory device of claim 4, further comprising a charge storage insulating layer extending between the word line and the fin-shaped active region.

7. The memory device of claim 4, wherein the interlayer insulating layer comprises an etch stop layer in contact with a top surface of the fin-shaped active region; and wherein the etch stop layer has an etch selectivity with respect to the device isolation layer.

8. The memory device of claim 4, wherein a width of the fin-shaped active region that overlaps with the word line is less than a width of the fin-shaped active region in which the source and drain regions are formed.

* * * * *